(12) United States Patent
Sando et al.

(10) Patent No.: US 11,887,823 B2
(45) Date of Patent: *Jan. 30, 2024

(54) ELECTRON BIAS CONTROL SIGNALS FOR ELECTRON ENHANCED MATERIAL PROCESSING

(71) Applicant: VELVETCH LLC, Pasadena, CA (US)

(72) Inventors: Stewart Francis Sando, St. Petersburg, FL (US); Samir John Anz, La Crescenta, CA (US); David Irwin Margolese, Pomona, CA (US); William Andrew Goddard, Pasadena, CA (US)

(73) Assignee: VELVETCH LLC, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/306,603

(22) Filed: Apr. 25, 2023

(65) Prior Publication Data

US 2023/0260765 A1    Aug. 17, 2023

Related U.S. Application Data

(62) Division of application No. 17/668,301, filed on Feb. 9, 2022, now Pat. No. 11,688,588.

(51) Int. Cl.
*H01J 37/32* (2006.01)
*H05H 1/54* (2006.01)

(52) U.S. Cl.
CPC .. *H01J 37/32697* (2013.01); *H01J 37/32027* (2013.01); *H05H 1/54* (2013.01)

(58) Field of Classification Search
None
See application file for complete search history.

(56) References Cited

U.S. PATENT DOCUMENTS

| 4,464,223 A | 8/1984 | Gorin |
| 4,756,794 A | 7/1988 | Yoder |

(Continued)

FOREIGN PATENT DOCUMENTS

| JP | 4838736 B2 | 12/2011 |
| TW | 486720 B | 5/2002 |

(Continued)

OTHER PUBLICATIONS

Anz S. et al., "Etching with Electrons" Compound Semiconductor, vol. 26 Issue 5, Jul. 2020, pp. 1-6.

(Continued)

*Primary Examiner* — Srinivas Sathiraju
(74) *Attorney, Agent, or Firm* — Steinfl + Bruno LLP

(57) ABSTRACT

Systems and methods for material processing using wafer scale waves of precisely controlled electrons in a DC plasma is presented. A surface floating potential of a substrate placed atop a stage in a positive column of the DC plasma is adjusted and maintained to a reference potential. A periodic biasing signal referenced to the reference potential is capacitively coupled to the stage to control a surface potential at the substrate according to: an active phase for provision of kinetic energy to free electrons in the DC plasma for activation of targeted bonds at the surface of the substrate; a neutralization phase for repelling of the free electrons from the surface of the substrate; and an initialization phase for restoring an initial condition of the surface floating potential.

21 Claims, 29 Drawing Sheets

(56) References Cited

U.S. PATENT DOCUMENTS

| | | | |
|---|---|---|---|
| 5,039,376 A | | 8/1991 | Zukotynski et al. |
| 5,221,416 A | | 6/1993 | Kishi et al. |
| 5,882,538 A | * | 3/1999 | Martin .............. H01J 37/32027 |
| | | | 216/68 |
| 5,917,285 A | | 6/1999 | Gillis et al. |
| 6,022,587 A | * | 2/2000 | Hey ..................... C23C 16/4404 |
| | | | 427/255.27 |
| 6,027,663 A | * | 2/2000 | Martin .............. H01J 37/32596 |
| | | | 216/68 |
| 6,033,587 A | * | 3/2000 | Martin ................ H01J 37/3233 |
| | | | 156/345.43 |
| 6,048,435 A | | 4/2000 | DeOrnellas et al. |
| 6,258,287 B1 | * | 7/2001 | Martin .................. B08B 7/0035 |
| | | | 438/731 |
| 6,335,536 B1 | | 1/2002 | Goeckner et al. |
| 6,399,507 B1 | * | 6/2002 | Nallan .................. H01J 37/321 |
| | | | 438/720 |
| 6,579,463 B1 | * | 6/2003 | Winningham ........ C23C 14/042 |
| | | | 428/522 |
| 6,646,386 B1 | | 11/2003 | Sirkis et al. |
| 6,656,568 B1 | * | 12/2003 | Winningham ......... B82Y 30/00 |
| | | | 428/141 |
| 6,660,127 B2 | * | 12/2003 | Nallan .................. H01J 37/321 |
| | | | 118/723 AN |
| 6,720,268 B1 | | 4/2004 | Laermer et al. |
| 6,776,170 B2 | * | 8/2004 | Liu .................... H01J 37/32733 |
| | | | 134/1.1 |
| 6,784,085 B2 | * | 8/2004 | Cuomo ............... H01J 37/3408 |
| | | | 204/192.15 |
| 6,852,195 B2 | * | 2/2005 | Martin .............. H01J 37/32018 |
| | | | 118/728 |
| 6,884,717 B1 | | 4/2005 | Desalvo et al. |
| 7,431,796 B2 | * | 10/2008 | Martin .............. H01J 37/32623 |
| | | | 156/345.43 |
| 7,777,197 B2 | | 8/2010 | Al-Bayati et al. |
| 9,245,752 B2 | | 1/2016 | Yeom et al. |
| 9,620,382 B2 | | 4/2017 | Oehrlein et al. |
| 10,368,427 B2 | | 7/2019 | Morrisroe |
| 10,504,742 B2 | | 12/2019 | Zaitsu et al. |
| 11,239,094 B2 | | 2/2022 | Kanarik |
| 11,599,228 B2 | * | 3/2023 | Lee ........................ G06F 3/0446 |
| 11,664,195 B1 | * | 5/2023 | Goddard ........... H01J 37/32045 |
| | | | 315/111.21 |
| 11,676,797 B2 | * | 6/2023 | Goddard ........... H01J 37/32045 |
| | | | 315/111.21 |
| 11,688,588 B1 | * | 6/2023 | Sando ............... H01J 37/32706 |
| | | | 156/345.24 |
| 11,715,623 B2 | * | 8/2023 | Goddard ........... H01J 37/32027 |
| | | | 315/111.21 |
| 2001/0019745 A1 | | 9/2001 | Beele et al. |
| 2002/0008017 A1 | | 1/2002 | Fu |
| 2003/0178300 A1 | | 9/2003 | Signer et al. |
| 2004/0163763 A1 | * | 8/2004 | Martin .............. H01J 37/32623 |
| | | | 156/345.43 |
| 2009/0057135 A1 | | 3/2009 | Fujii et al. |
| 2009/0302024 A1 | | 12/2009 | Aiba |
| 2010/0025369 A1 | | 2/2010 | Negishi et al. |
| 2011/0139748 A1 | | 6/2011 | Donnelly et al. |
| 2013/0255717 A1 | | 10/2013 | Rose et al. |
| 2013/0276978 A1 | | 10/2013 | Bluck et al. |
| 2014/0076716 A1 | | 3/2014 | Gorokhovsky et al. |
| 2016/0293432 A1 | | 10/2016 | Ranjan et al. |
| 2017/0062190 A1 | | 3/2017 | Lee et al. |
| 2018/0174860 A1 | | 6/2018 | Kanarik |
| 2018/0190526 A1 | | 7/2018 | Hao et al. |
| 2018/0226225 A1 | | 8/2018 | Koh et al. |
| 2019/0267211 A1 | * | 8/2019 | Pan .................... H01L 21/02233 |
| 2021/0302846 A1 | | 9/2021 | Tsuda et al. |
| 2021/0313949 A1 | | 10/2021 | Jin et al. |
| 2023/0140979 A1 | | 5/2023 | Goddard et al. |
| 2023/0143453 A1 | | 5/2023 | Goddard et al. |
| 2023/0144264 A1 | | 5/2023 | Goddard et al. |

FOREIGN PATENT DOCUMENTS

| | | |
|---|---|---|
| TW | 201400206 A | 1/2014 |
| WO | 00/33362 A1 | 6/2000 |
| WO | 2010/008598 A1 | 1/2010 |
| WO | 2023/086731 A1 | 5/2023 |
| WO | 2023/154613 A1 | 8/2023 |

OTHER PUBLICATIONS

Anz, Samir J. et al., "Damage-Free Atomic-Scale Etching and Surface Enhancements by Electron-Enhanced Reactions: Results and Simulations", Chapter 26 of "Computational Materials, Chemistry, and Biochemistry: From Bold Initiatives to the Late Mile," Shankar, S. et al., Editors, *Springer Series in Materials Science*, vol. 284, Jan. 2021, 30 pages.

Barden M. "Plasma Process for Surface Treatment of Implants" *Medical Design Briefs*, Jun. 2020, pp. 1, 12-14.

Elliot J. "treating Titanium and Polymer with Plasma Processing" *U.S. Tech*, vol. 35 No. 12, Dec. 2020, 2 pages.

Gillis H.P. et al., "Damage-free Pattern Transfer by Low Energy Electron Enhanced Etching (LE4): Mechanisms and Applications" *ECS Transactions*, 2008, vol. 13 No. 8, pp. 35-46.

Gillis H.P. et al., "Highly Anisotropic, Ultra-Smoth Patterning of GaN/SiC by Low Energy Electron Enhanced Etching in DC Plasma" Journal of Electronic Materials, vol. 26 No. 3, 1997, pp. 301-305.

Gillis H.P. et al., "Low energy electron-enhanced etching of GaAs (100) in a chlorine/hydrogen dc plasma" *Appl. Phys. Lett.*, 68(16), Apr. 1996, pp. 2255-2257.

Gillis H.P. et al., "Low energy electron-enhanced etching of Si(100) in hydrogen/helium direct-current plasma" *Appl. Phys. Lett.*, 66(19), May 1995, pp. 2475-2477.

Gillis H.P. et al., "Low-energy electron beam enhanced etching of Si(100)-(2x1) by molecular hydrogen" *J. Vac. Sci. Technol. B*, Aug. 1992, vol. 10 No. 6, pp. 2729-2733.

Gillis H.P. et al., "Precision, Damage-Free Etching by Electron-Enhanced Reactions: Results and Simulations" ECS Transactions, 50(46), Dec. 2013, pp. 33-43.

Huard C. M. et al., "Atomic layer etching of 3D structures in silicon: Self-limiting and nonideal reactions" *J. Vac. Sci. Technol.*, vol. 35 No. 3, Jun. 2017 15 pages.

International Search and Written Opinion for International application No. PCT/US2023/060988 filed Jan. 20, 2023 on behalf of Velvetch LLC, dated Apr. 25, 2023. (9 pages).

International Search Report and Written Opinion for International Application No. PCT/US2022/078600 filed Oct. 24, 2022 on behalf of Velvetch LLC, dated Jan. 30, 2023. (10 pages).

Kim J. et al., "Low-Energy Electron-Enhanced Etching of HgCdTe" *Journal of Electronic Materials*, vol. 32 No. 7, Jan. 2003, pp. 677-685.

Lee S.H. et al., "Morphological evolution of III-V semiconductors and SiO2 during low energy electron enhanced dry etching" *Journal of Vacuum Science & Technology A*, Jul. 2004, vol. 22 No. 4, pp. 1600-1605.

Morling R. "New plasma process delivers superior surface treatment of titanium and polymer implants" Design Solutions, Mar. 2020, 2 pages.

Nojiri K. "Atomic layer etching of GaN and AlGaN using plasma-enhanced approach" *ResearchGate*, Mar. 2018, 3 pages.

Non-Final Office Action for U.S. Appl. No. 17/668,301, filed Feb. 9, 2022 on behalf of Velvetch LLC, dated Nov. 3, 2022, (20 pages).

Non-Final Office Action for U.S. Appl. No. 17/942,808, filed Sep. 12, 2022 on behalf of Velvetch LLC; dated Dec. 14, 2022;16 pages.

Non-Final Office Action for U.S. Appl. No. 17/946,434, filed Sep. 16, 2022, on behalf of Velvetch LLC, dated Dec. 21, 2022, 16 pages.

Non-Final Office Action issued for U.S. Appl. No. 17/524,330, filed Nov. 11, 2021, on behalf of Velvetch LLC. dated Jul. 13, 2022. 11 Pages.

Notice of Allowance U.S. Appl. No. 17/668,301, filed Feb. 9, 2022 on behalf of Velvetch LLC, dated Feb. 13, 2023. (15 pages).

Notice of Allowance for U.S. Appl. No. 17/524,330, filed Nov. 11, 2021 on behalf of Velvetch LLC, dated Jan. 11, 2023, (12 pages).

(56) References Cited

OTHER PUBLICATIONS

Notice of Allowance for U.S. Appl. No. 17/524,330, filed Nov. 11, 2021 on behalf of Velvetch LLC, dated Oct. 31, 2022, (9 pages).
Notice of Allowance for U.S. Appl. No. 17/942,808, filed Sep. 12, 2022 on behalf of Velvetch LLC; dated Mar. 16, 2023; 9 pages.
Notice of Allowance for U.S. Appl. No. 17/946,434, filed Sep. 16, 2022, on behalf of Velvetch LLC, dated Mar. 16, 2023, 10 pages.
Notice of Allowance issued for U.S. Appl. No. 17/524,330, filed Nov. 11, 2021, on behalf of Velvetch LLC. dated Aug. 24, 2022. 8 Pages.
Restriction Requirement for U.S. Appl. No. 17/668,301, filed Feb. 9, 2022 on behalf of Velvetch LLC. dated Jul. 15, 2022 7 pages.
Restriction Requirement issued for U.S. Appl. No. 17/524,330, filed Nov. 11, 2021, on behalf of Velvetch LLC. dated May 18, 2022. 6 Pages.
Second Restriction Requirement for U.S. Appl. No. 17/668,301, filed Feb. 9, 2022, on behalf of Velvetch LLC. dated Aug. 26, 2022. 6 Pages.
Veprek S. et al., "Electron-Impact-Induced Anisotropic Etching of Silicon by Hydrogen" Plasma Chemistry and Plasma Processing, vol. 2 No. 3, Jun. 1982, pp. 233-246.
Wang X. et al., "Scaling of atomic layer etching of SiO2 in fluorocarbon plasmas: Transient etching and surface roughness" *J. Vac. Sci. Technol.*, vol. 39 No. 3, Jun. 2021, 18 pages.
Webb A.P. et al., "Reactivity of Solid Silicon with Hydrogen under conditions of a low pressure plasma" Chemical Physics Letters, vol. 62 No. 1, Mar. 1979, pp. 173-177.
Winningham T. A. et al., "Formation of ordered nanocluster arrays by self-assembly on nanopatterned Si(100) surfaces" *Surface Science*, vol. 406, 1998, pp. 221-228.
Corrected Notive of Allowability for U.S. Appl. No. 17/668,301, filed Feb. 9, 2022 on behalf of Velvetch LLC, dated May 17, 2023. (3 pages).
Non-Final Office Action for U.S. Appl. No. 18/149,893, filed Jan. 4, 2023 on behalf of Velvetch LLC, dated May 18, 2023, (15 pages).
Non-Final Office Action for U.S. Appl. No. 18/301,126, filed Apr. 14, 2023 filed on behalf of Velvetch LLC, dated Aug. 17, 2023 (16 pages).
Notice of Allowance for U.S. Appl. No. 18/149,893, filed Jan. 4, 2023 on behlaf of Velvetch LLC, dated Aug. 29, 2023, (11 pages).
International Search and Written Opinion for International application No. PCT/US2023/030225 filed Aug. 15, 2023 on behalf of Velvetch LLC, dated Nov. 2, 2023. (12 pages).

\* cited by examiner

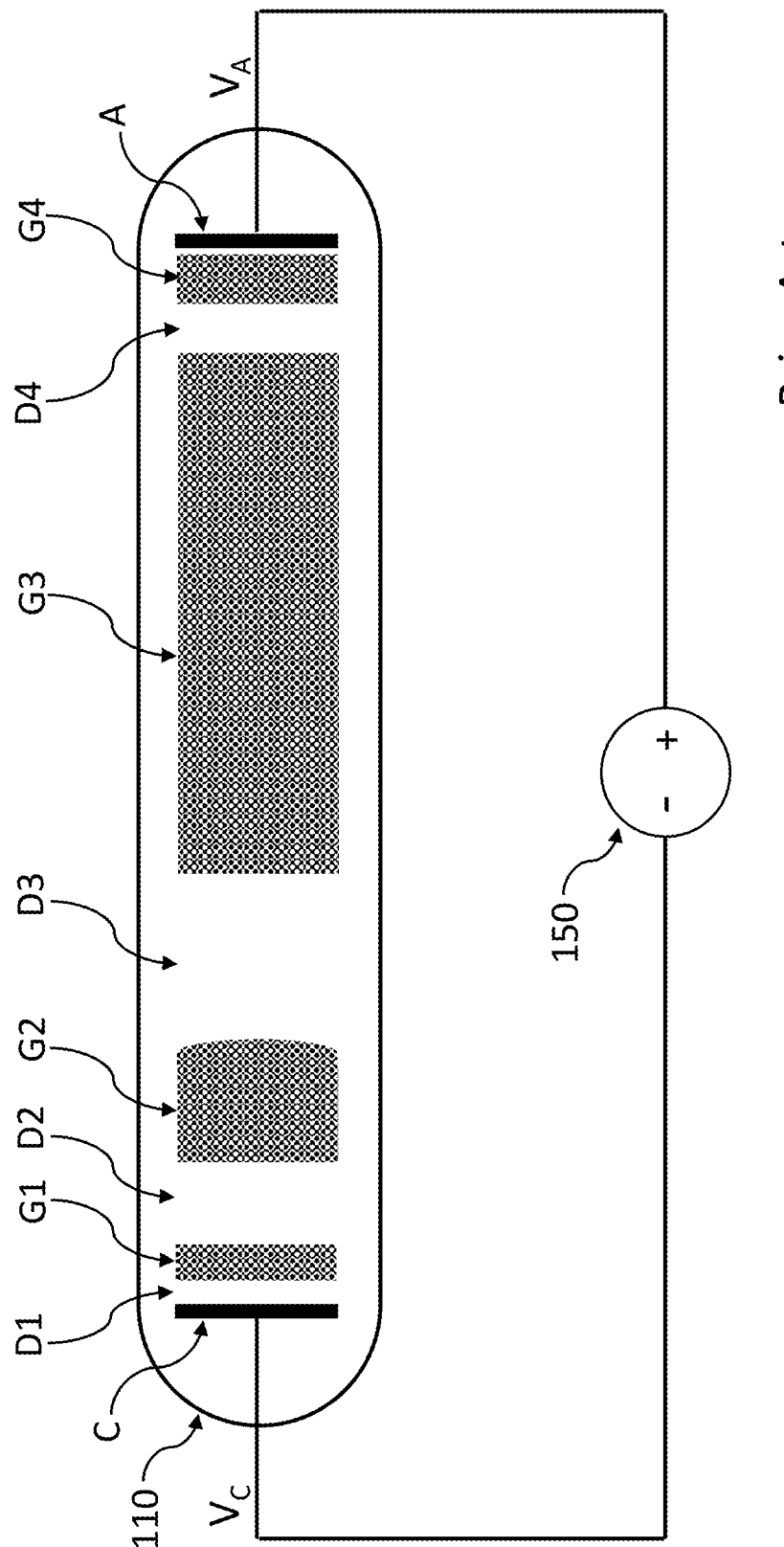
FIG. 1A _Prior Art_

ELECTRON BIAS CONTROL SIGNALS FOR ELECTRON ENHANCED MATERIAL PROCESSING

CROSS REFERENCE TO RELATED APPLICATIONS

This patent application is a divisional application of U.S. patent application Ser. No. 17/668,301, filed on Feb. 9, 2022, the disclosure of which is incorporated herein by reference in its entirety The present application is related to U.S. Application No. 17/524,330, entitled "DC Plasma Control for Electron Enhanced Material Processing" filed on Nov. 11, 2021, the disclosure of which is incorporated herein by reference in its entirety.

TECHNICAL FIELD

The present disclosure generally relates to systems and methods for controlling free electrons in a DC plasma reaction chamber used for material processing, in particular, generation of waveforms for biasing signals to control the kinetic energy of free electrons such as to produce wafer scale waves of precisely controlled electrons in a DC plasma at room temperatures (or other temperatures when desired).

BACKGROUND

Fabrication of, for example, integrated circuits, may include processing of corresponding substrates within a (direct-current) DC plasma reaction chamber wherein electrons and/or ions are accelerated towards the surface of the substrate to initiate a reaction that physically transforms the surface of the substrate. In some cases, and mainly due to the relatively smaller mass of electrons compared to ions, substrate processing via electrons may be preferred so as to reduce any damage to the surface of the substrate beyond the targeted physical alterations expected by the processing step per se.

In some cases, plasma processing may include arrangement of the substrate in a region of the DC plasma reaction chamber such that an exact value of a surface floating potential of the substrate is not known. Accordingly, any externally applied bias signal to the substrate may impart an energy to free electrons in a region of the plasma close to the surface of the substrate that may not correlate to the electron energy thresholds/levels of (atoms) materials present at the surface of the substrate.

The above referenced U.S. Application No. 17,524,330, the disclosure of which is incorporated herein by reference in its entirety, describes methods and systems for precise and selective control of the value of the surface floating potential of the substrate, and therefore enable precise and selective control of energy levels of atoms at the surface of the substrate. Teachings according to the present disclosure take advantage of such precise and selective control of the energy levels of atoms at the surface of the substrate to produce corresponding timing and amplitude of waveforms for signals used for biasing of the free electrons in the DC plasma chamber so to generate wafer scale waves of electrons that specifically target the energy levels of the atoms at the surface of the substrate.

SUMMARY

Systems and methods for material processing using wafer scale waves of precisely controlled electrons in a DC plasma at room temperatures (or other temperatures if desired) are presented. In the present disclosure such material processing is referred to as electron enhanced material processing (EEMP) which allows precise control of the kinetic energy of free electrons in the DC plasma to exactly (and selectively) target energy levels of the electrons of atoms at the surface of a substrate being processed.

According to a first embodiment of the present disclosure, a direct-current (DC) plasma system for processing of a substrate is presented, comprising: a DC plasma reaction chamber configured to contain a DC plasma that is generated between an anode and a cathode of the DC plasma reaction chamber; a substrate support stage arranged in a region of the DC plasma reaction chamber that contains a positive column of the DC plasma; means to preset a floating potential at a surface of the substrate support stage to a reference potential; and a biasing signal generator that is capacitively coupled to the substrate support stage, the biasing signal generator configured to generate a periodic biasing signal having a voltage that is referenced to the reference potential, the periodic biasing signal comprising: an active phase having a positive voltage; a neutralization phase having a negative voltage; and an initialization phase having a zero voltage.

According to a second embodiment of the present disclosure, a method for processing a surface of a substrate is presented, the method comprising: placing a substrate on a support stage in a region of a DC plasma reaction chamber configured to produce a positive column of DC plasma; generating the DC plasma; presetting a floating potential at the surface of the substrate to a reference potential; and capacitively coupling, to the support stage, a periodic biasing signal having a biasing voltage that is referenced to the floating potential, the periodic biasing signal comprising: an active phase having a positive voltage that is based on a known reaction threshold voltage of targeted chemical bonds comprised of electrons of atoms at the surface of a substrate; a neutralization phase having a negative voltage; and an initialization phase having a zero voltage.

Further aspects of the disclosure are shown in the specification, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a simplified schematic view of a DC plasma reaction chamber that can be used in a DC plasma processing system.

Like reference numbers and designations in the various drawings indicate like elements.

DETAILED DESCRIPTION

FIG. 1A shows a simplified schematic view of a prior art (direct-current) DC plasma reaction chamber (110) that can be used in a DC plasma processing system. Biasing of the DC plasma reaction chamber (110) may be provided by a DC voltage source (150) coupled between an anode, A, and a cathode, C, of the DC plasma reaction chamber (110). During operation, a glow discharge (plasma) may be formed in the chamber (110) based on interaction of a gas and electrons of a current that flows between the anode, A, and the cathode, C. This in turn produces free ions and electrons in the chamber (110). The principle of operation of such DC plasma reaction chamber (110) is well known to a person skilled in the art and therefore related details are omitted in the present disclosure.

As shown in FIG. 1A, the glow discharge formed in the chamber (110) may include glow regions (G1, G2, G3, G4) that emit significant light, and dark regions (D1, D2, D3, D4) that may not emit light. Such regions may represent different operating characteristics of the DC plasma reaction chamber (110), including, for example, temperature and electric potential.

Figure 1B:
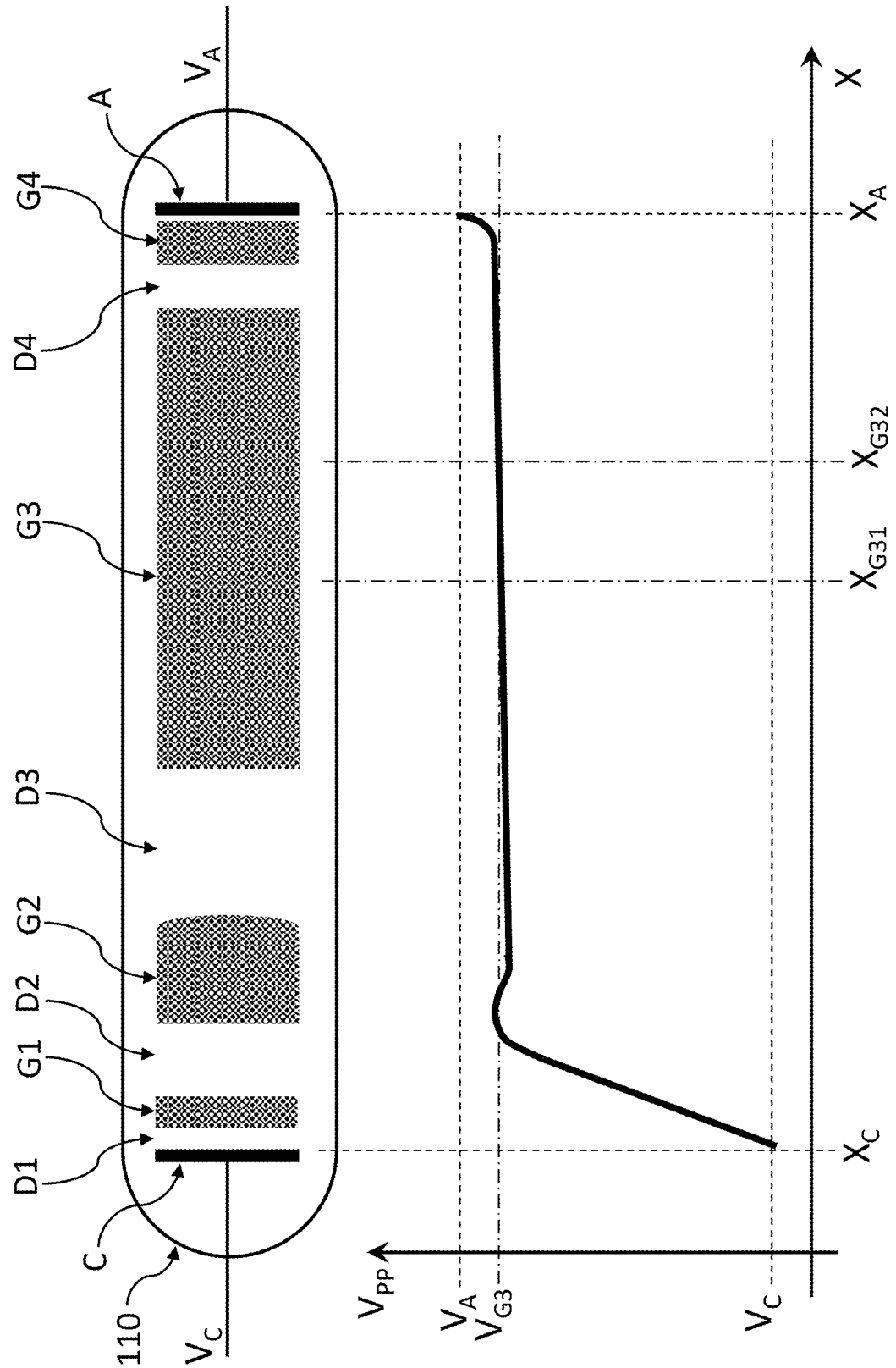
FIG. 1B shows a graph representative of a variation in (electric) potential of the plasma during operation of the DC plasma reaction chamber of FIG. 1A.

FIG. 1B shows a graph representative of a variation in the (electric) potential, $V_{PP}$, of the plasma along an axial direction (direction of longitudinal extension), X, of the chamber (110) during operation. As shown in FIG. 1B, the plasma potential, $V_{PP}$, varies from a value, $V_C$, that represents the potential applied to the cathode, C, by the DC voltage source (150 of FIG. 1A), to a value, $V_A$, that represents the potential applied to the anode, A, by the DC voltage source (150 of FIG. 1A). It should be noted that as shown for example in FIG. 1D later described, generally the value, $V_A$, is at zero volts (e.g., reference ground) and the value, $V_C$, is negative (e.g., in a range of about 0 (zero) to −500 volts).

With continued reference to FIG. 1B, abrupt variation of the potential, $V_{PP}$, in the regions (e.g., D1, G1, D2) close to the cathode, C, and in the regions (e.g., G4) close to the anode, A, may correspond to regions of higher operating temperatures of the chamber (110). On the other side, the region G3, also known as the positive column, is a region of quasi uniform/constant potential, $V_{PP}$, and of lower operating temperature. For example, considering a segment [$X_{G31}$, $X_{G32}$] along the axial direction, X, of the chamber (110) that as shown in FIG. 1B is contained within the positive column region, G3, a variation of the plasma potential, $V_{PP}$, across such segment [$X_{G31}$, $X_{G32}$] is minimal, or in other words, the potential, $V_{PP}$, across the segment [$X_{G31}$, $X_{G32}$] may be considered as constant. Accordingly, as shown in FIG. 1B, the plasma potential, $V_{PP}$, across the segment [$X_{G31}$, $X_{G32}$] may be considered as equal to a value $V_{G3}$. The lower operating temperature and the constant potential value of the plasma in the positive column region, G3, allow use of such region for processing of substrates as shown in FIG. 1C and FIG. 1D.

Figure 1C:
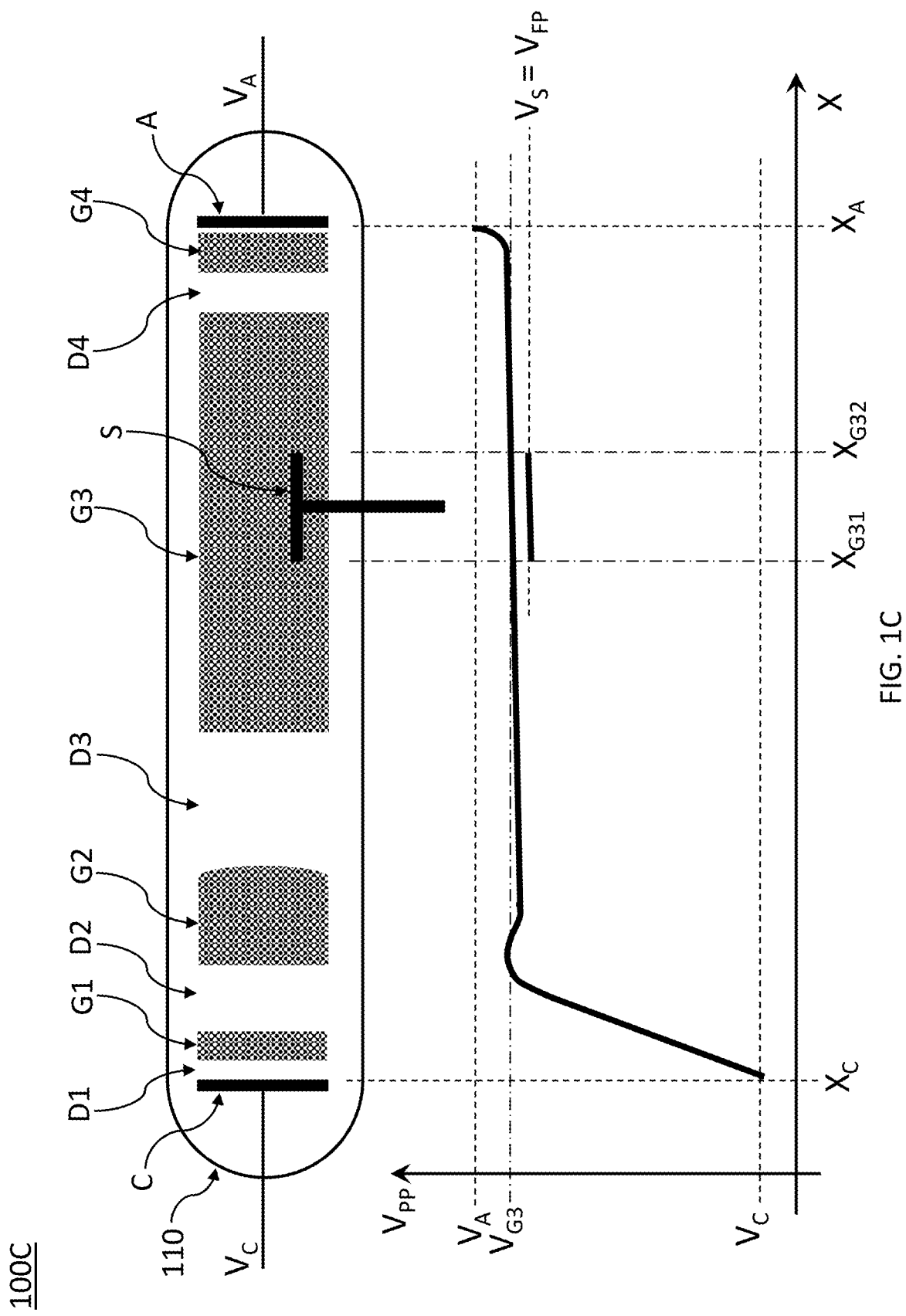
FIG. 1C shows a simplified schematic view of a DC plasma processing system comprising a (substrate) stage arranged in a region of the DC plasma reaction chamber of FIG. 1A.

FIG. 1C shows a simplified schematic view of a DC plasma processing system (100C) comprising a (substrate) stage, S, arranged in the positive column region, G3, of the DC plasma reaction chamber (110). The stage, S, may be designed to support a flat substrate, and therefore may include a top flat/planar surface. The stage, S, shown in FIG. 1C is electrically isolated (not connected to any external electric potential) and therefore, and as known to a person skilled in the art, in the presence of the plasma potential, $V_{PP}$, a potential, $V_S$, develops at the surface of the stage, S, that is referred to as the surface floating potential, $V_{FP}$. The relationship of the (surface) floating potential, $V_{FP}$, to the plasma potential, $V_{PP}$, is shown FIG. 1C. In particular, as shown in FIG. 1C, the plasma potential, $V_{PP}$, at a region [$X_{G31}$, $X_{G32}$] of the chamber (110) where the stage, S, is arranged is equal to $V_{G3}$, and the floating potential, $V_{FP}$, is lower than (negative with respect to) the plasma potential $V_{G3}$.

The floating potential, $V_{FP}$, shown in the graph of FIG. 1C can be attributed to the "plasma sheath" that develops in the presence of the stage, S. As known to a person skilled in the art, at the wall or any barrier within the plasma, a negative potential develops with respect to the bulk of the plasma. Consequently, an equilibrium potential drop develops between the bulk of the plasma and the wall or barrier. Such potential drop is confined to a small region of space next to the wall or barrier due to the charge imbalance that develops between the plasma and the wall or barrier. This layer of charge imbalance has a finite thickness, characterized by the Debye Length, and is called the "plasma sheath" or "sheath". The thickness of such a layer is several Debye lengths thick, a value whose size depends on various characteristics of the plasma. If the dimensions of the bulk plasma (e.g., chamber 110) are much greater than the Debye length, for example, then the Debye length depends on the plasma temperature and electron density. In the particular case of the DC plasma operating conditions supported by the teachings according to the present disclosure (e.g., EEMP system near room temperature to moderately above room temperature), the Debye length is in the order of several millimeters (e.g., less than 10 millimeters), and the difference between the potentials $V_{G3}$ and $V_{FP}$ is in the order of several volts (e.g., less than 10 volts). It should be noted that the plasma sheath may develop in the presence of any wall or barrier, whether conductive or not. Accordingly, once a substrate (whether conductive or insulating) is placed atop the stage, S, the same floating potential, $V_{FP}$, as described above with reference to FIG. 1C may develop at the surface of the substrate.

Figure 1D:
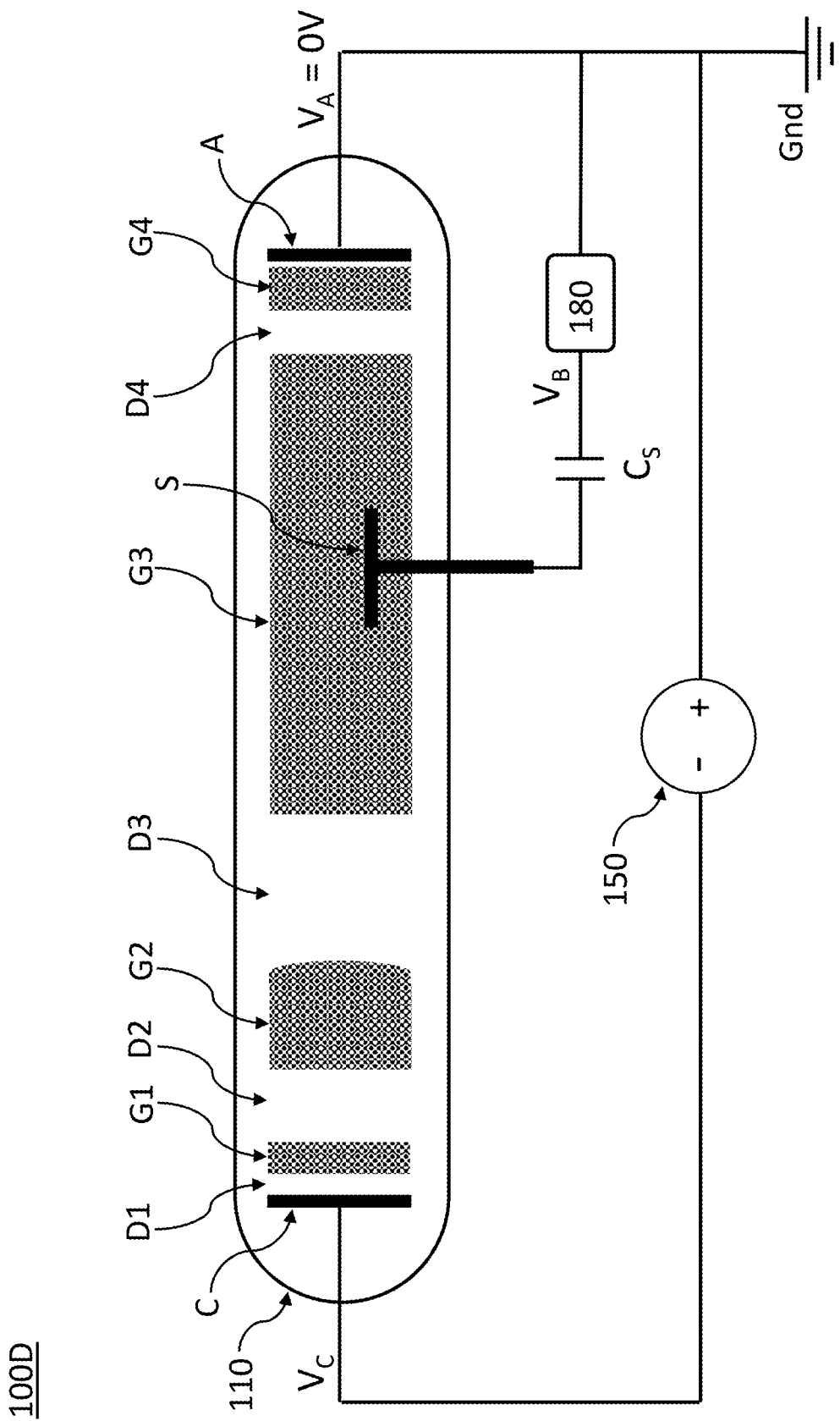
FIG. 1D shows an exemplary biasing of the stage of the DC plasma processing system of FIG. 1C via an external biasing signal generator.

FIG. 1D shows an exemplary biasing of the stage, S, of the DC plasma processing system of FIG. 1C via an external biasing signal generator (180) that is capacitively coupled to the stage, S, by a capacitor $C_S$. In the exemplary configuration (100D) shown in FIG. 1D, the potential, $V_A$, applied to the anode, A, is at zero volts (e.g., coupled to the reference ground, Gnd). Furthermore, as shown in FIG. 1D, a biasing signal, $V_B$, applied to the stage, S, by the external biasing signal generator (180) may be referenced to the reference ground potential, Gnd. Although in some prior art implementations the biasing signal, $V_B$, may be DC coupled to the stage, S, teachings according to the present disclosure strictly prohibit such DC coupling to the stage so as to avoid a discharge path for a DC current through any intermediate points in the chamber (110), as such discharge path may substantially change operating conditions within the chamber (110).

In the DC plasma processing system shown in FIG. 1D, the biasing signal, $V_B$, may be used to control a potential (e.g., surface potential $V_S$) seen by free electrons and/or ions in the vicinity of the stage, S, or of the substrate when present. Accordingly, energy of the free electrons and/or ions may be controlled to the material specific levels required for (optimum) processing of the substrate. For example, as shown in the left-side graph of FIG. 1E, the biasing signal, $V_B$, generated by the external biasing signal generator (e.g., 180 of FIG. 1D) may start from zero and reach in a short period of time (represented by a leading edge slope) a voltage amplitude, $V_{B1}$. When the voltage amplitude, $V_{B1}$, is applied (e.g., AC coupled) to the stage, S, during a processing step (a) as shown in the top right-side graph of FIG. 1E, the voltage amplitude, $V_{B1}$, gets added (or subtracted if negative) to the surface floating potential, $V_{FPa}$, to generate a surface potential, $V_S$, at the vicinity of the stage, S. However, because the free electrons and/or ions are at the plasma potential, $V_{PPa}$, only a portion of the surface potential, $V_S$, that is above the plasma potential, $V_{PPa}$, is seen by the free electrons and/or ions. For example, as shown in the top right-side graph of FIG. 1E, the (kinetic) energy of the free electrons and/or ions may be based on a potential difference $V_{KEa} = (V_{B1} - \Delta V_{FPa})$, with $\Delta V_{FPa} = (V_{PPa} - V_{FPa})$.

Figure 1E:
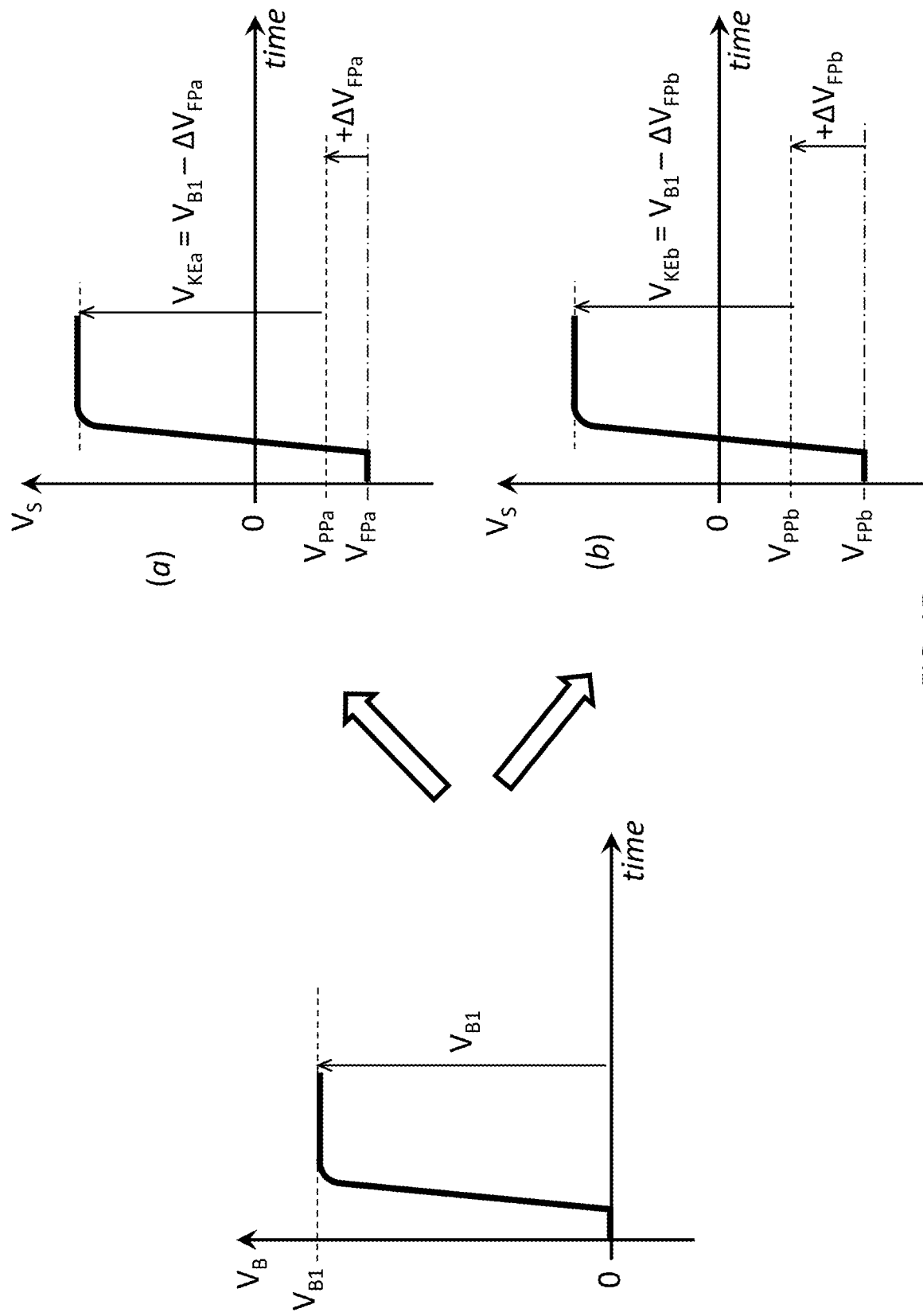
FIG. 1E shows an exemplary biasing signal generated by the external biasing signal generator of FIG. 1D and a corresponding potential generated at the surface of the stage.

On the other hand, considering a processing step (b) represented by the bottom right-side graph of FIG. 1E, which may have operating conditions that are different from the operating conditions of the processing step (a), including for example, a different plasma potential, $V_{PPb}$, or a different floating potential, $V_{FPb}$, that may cause a different differential $\Delta V_{FPb} = (V_{PPb} - V_{FPb})$, then for the same applied voltage amplitude, $V_{B1}$, a different (kinetic) energy of the free electrons and/or ions is obtained. Teachings according to the present disclosure either eliminate variations in the operating conditions within the chamber (e.g., 110 of FIG. 1D), and/or compensate for such variations such as to allow, for example, precise control of the energy of the free electrons (and/or ions). It should be noted that variation in the operating conditions may be expected in view of different types of processing (e.g., (a) and (b) of FIG. 1E) performed within the chamber (110), including for example, etching of a substrate with different reactive gasses, cleaning of a substrate or any other process that may alter and/or remove composition/material from the surface of the substrate. It should be noted that, as known by a person skilled in the art, the different operating conditions for performing the different types of processing may further include corresponding variations and/or adjustments to any one of the DC plasma current, temperature, gas mixture or flow rate within the chamber (110).

When a substrate is placed atop the surface of the stage, S, the kinetic energy of the free electrons and/or ions acquired through the application of the bias signal, $V_B$, described above may accelerate the free electrons and/or ions towards the surface of the substrate and collide with the substrate to release the kinetic energy onto atoms at the surface of the substrate. Those atoms however are at an energy level that is based on the potential within which they reside, or in other words, based on the floating potential, $V_{FP}$. Various energy levels of one such atom for the processing type (a) described above with reference to FIG. 1E are shown in FIG. 1F, including the energy level, $E_n$, of a nucleus of an atom at the surface of the substrate, the energy level, $E_B$, of an electron bound to the nucleus of an atom at the surface of the substrate, and the energy level, $E_e$, of an electron at the orbit of an electron bound to a nucleus at the surface of the substrate.

Figure 1F:
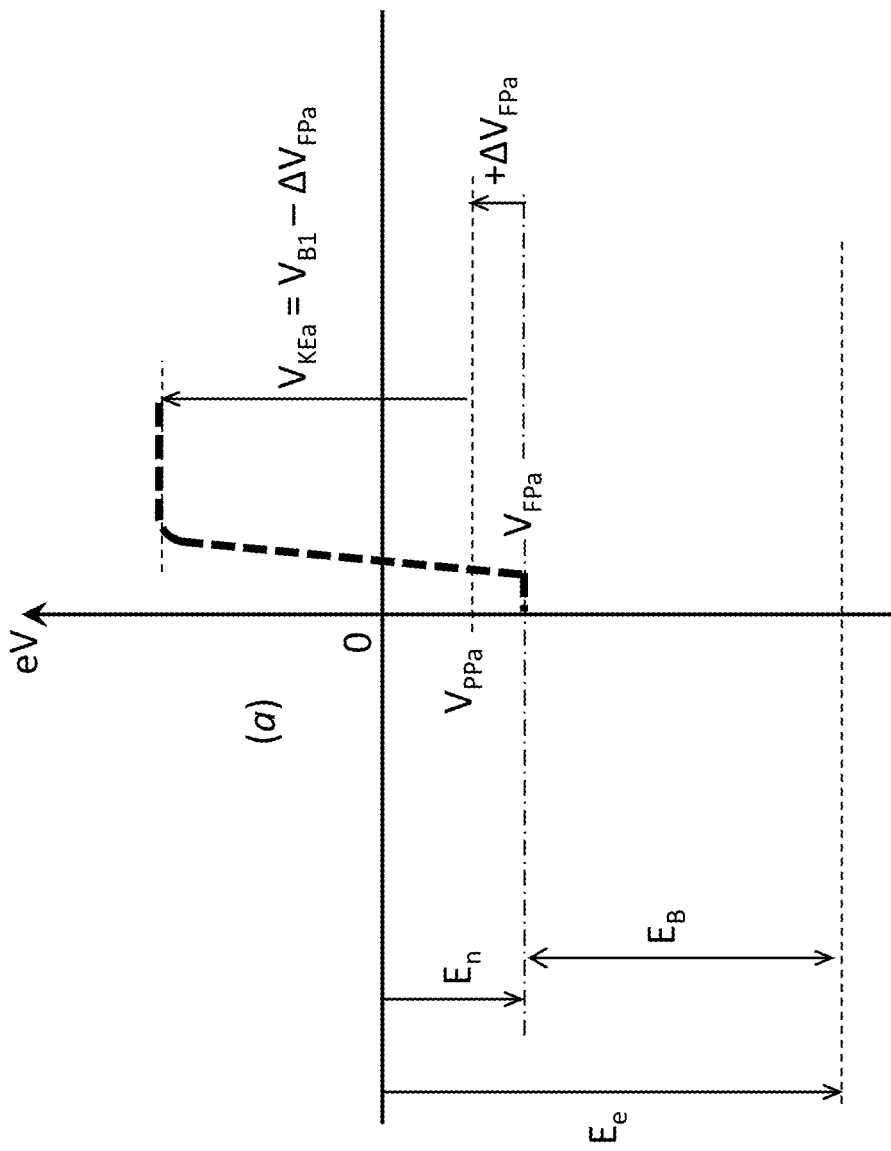
FIG. 1F shows exemplary energy levels of atoms at a surface of the stage.

As can be seen in FIG. 1F, the energy level, $E_n$, of the nucleus is at the (negative) potential, $V_{FPa}$, and the energy level, $E_e$, of the electron is at the (negative) potential ($E_n + E_B$). In other words, in order to excite the atom to a level that breaks the bond between the electron and the nucleus, an energy equal to, or greater than, the energy level, $E_e$, of the electron must be imparted onto the atom. Accordingly, considering a plasma processing only via the free electrons, the kinetic energy of the free electrons provided through application of the bias signal, $V_B$, represented in FIG. 1F by the potential difference $V_{KEa} = (V_{B1} - \Delta V_{FPa})$ must be equal to, or greater than, the energy level, $E_e$. However, since $E_e=(E_n+E_B)$ and $E_n$ is based on the a priori unknown floating potential, $V_{FPa}$, precise control of the kinetic energy of the free electrons to precisely target the energy level, $E_e$, may not be possible.

Although the floating potential (e.g., $V_{FPa}$ of FIG. 1F) may be empirically and/or experimentally determined for a given process at stable operating conditions of the DC plasma chamber, any inconsistencies and/or lack of repeatability of such operating conditions may invalidate the determined floating potential. Furthermore, as different types of processes inherently yield to different floating potentials, the task of precisely controlling the kinetic energy of the free electrons to exactly target the energy level of an atom at the surface of the substrate may not be feasible. As a result, some prior art implementations impart kinetic energies onto the atoms at the surface of the substrate that may be substantially larger than a target atom energy level, and therefore may not allow for selectivity (as atoms of different materials/compositions having different energy levels may equally be subjected to energy levels sufficient to break their orbital bonds). Electron enhanced material processing (EEMP) according to the teachings of the present disclosure overcome such shortcoming and therefore allow precise control of the kinetic energy of the free electrons to exactly and selectively target the energy level of an atom at the surface of the substrate.

Figure 2A:
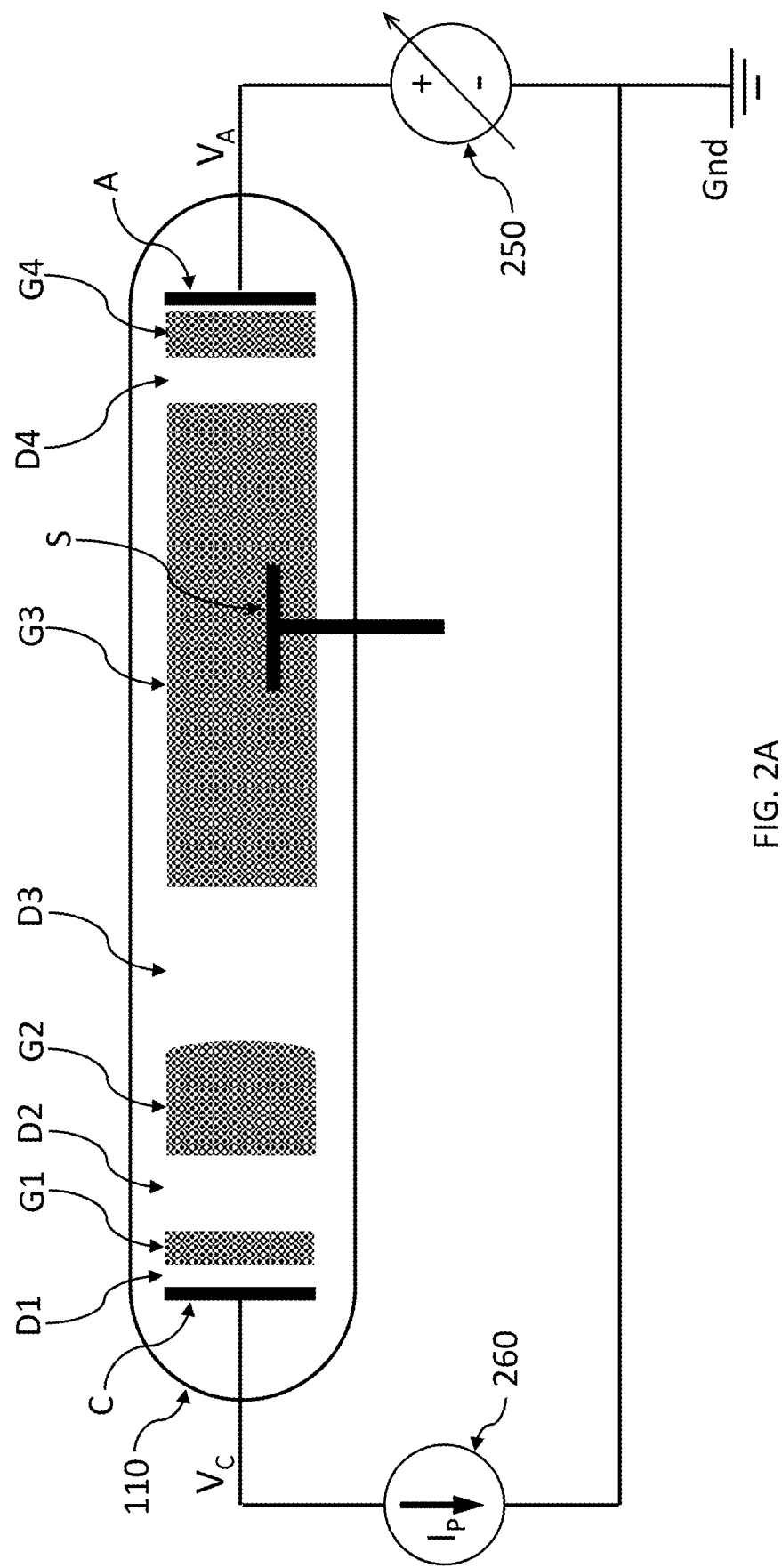
FIG. 2A shows a simplified schematic view of a DC plasma processing system according to an embodiment of the present disclosure comprising means to control a surface potential of the stage.

FIG. 2A shows a simplified schematic view of a DC plasma processing system (200A) according to an embodiment of the present disclosure comprising means (250, 260) to control the surface potential of the stage, S, when electrically isolated. In other words, these means (250, 260) allow for adjustment of the floating potential, $V_{FP}$. As shown in FIG. 2A, the means (250, 260) include an adjustable DC voltage source (250) that is coupled to the anode, A, of the DC plasma reaction chamber (110), and a DC current source (260) that is coupled to the cathode, C, of the DC plasma reaction chamber (110). Accordingly, the potential, $V_A$, of the anode, A, may be controlled to be in a range from zero volts and upward (positive) with respect to the reference ground (Gnd at zero volts), and a (drain) current, Ip, that flows between the anode, A, and the cathode, C, through the reaction chamber (110) can be set by the DC current source (260). Accordingly, the potential, $V_C$, of the cathode, C, is not forced by an external DC voltage source (e.g., 150 of FIG. 1D), rather (it is floating and) settles to a (negative) voltage that is based on the adjustable potential $V_A$ of the anode A, and the set current, Ip. Such a configuration allows independently control/adjust of the floating potential, $V_{FP}$, while maintaining the set current, Ip, through the reaction chamber (110) constant to establish and maintain a higher level of process stability and optimization.

Figure 2B:
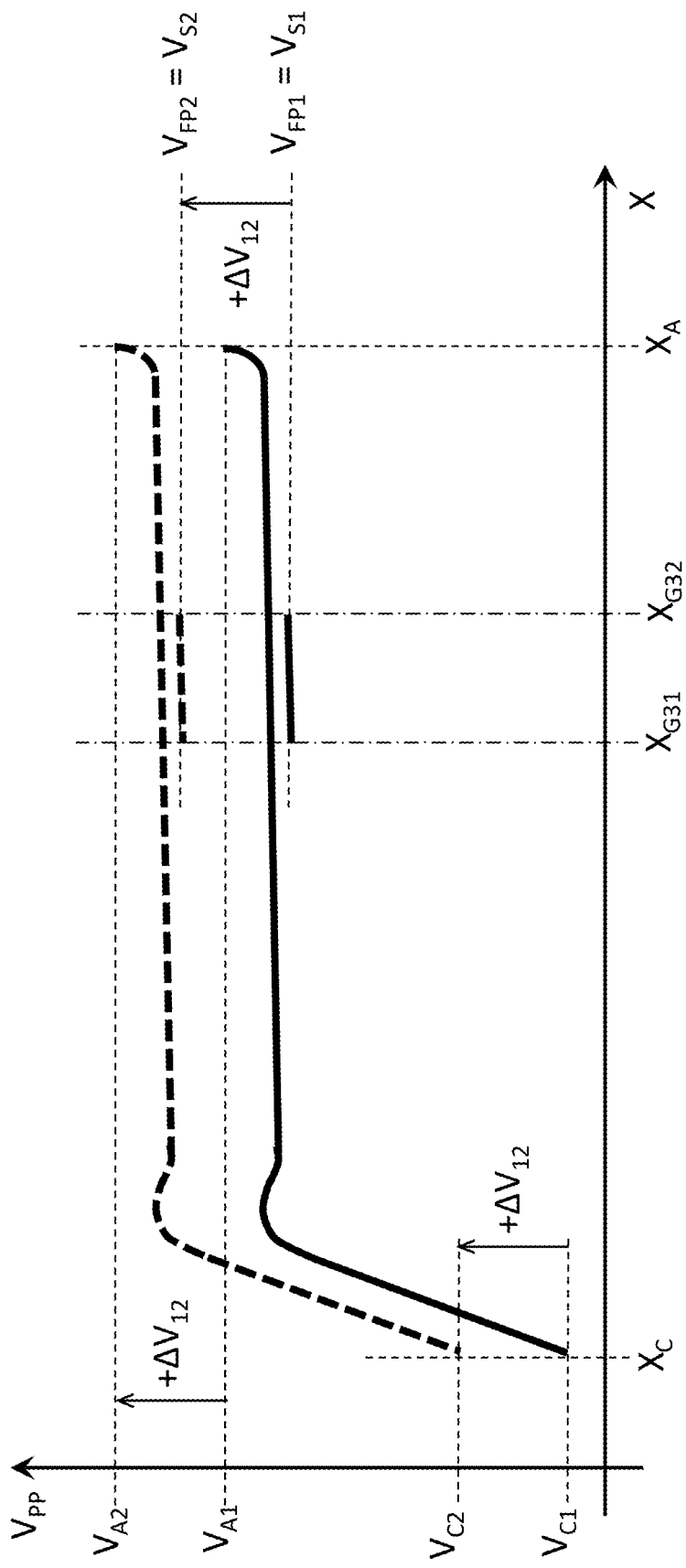
FIG. 2B shows graphs representative of control of the surface potential of the stage for the DC plasma processing system of FIG. 2A.

FIG. 2B shows two graphs representative of control of the surface potential, $V_{FP}$, of the stage, S, for the DC plasma processing system (200A) described above with reference to FIG. 2A. In particular, FIG. 2B shows two graphs distinguished by use of solid or dashed lines, each representing the variation of the plasma potential, $V_{PP}$, across the longitudinal extension, X, of the chamber (110) for two different voltages ($V_{A1}$, $V_{A2}$) applied to the anode, A, by the adjustable DC voltage source (250). As can be seen in FIG. 2B, for a positive step increase, $+\Delta V_{12}$, of the anode potential from the voltage $V_A$ to the voltage $V_{A2}$, the floating potential ($V_{FP1}$, $V_{FP2}$) and the cathode potential ($V_{C1}$, $V_{C2}$) increase by the same positive step, $+\Delta V_{12}$. As a matter of fact, as shown in FIG. 2B, the entirety of plasma potential, $V_{PP}$, curve shifts positive by the step $+\Delta V_{12}$. In other words, for any longitudinal coordinate, X, in the range [$X_C$, $X_A$], a corresponding plasma potential, $V_{PP}(X)$, follows the step increase, $+\Delta V_{12}$. The same behavior applies to negative step variations applied to the anode, A, by the adjustable DC voltage source (250). In other words, control of the anode, A, potential by the adjustable DC voltage source linearly affects the plasma potential, $V_{PP}$, at any longitudinal coordinate, X, and therefore, linearly affects the floating potential, $V_{FP}$, and the voltage, $V_S$, atop the stage, S, As later described in the present disclosure, such linearity can be used in the EEMP system according to the present teachings to implement a closed loop control subsystem to automatically control the value of the floating potential, $V_{FP}$, to a preset value (e.g., zero volts) while operating the DC plasma chamber for different types of material processing.

Figure 2C:
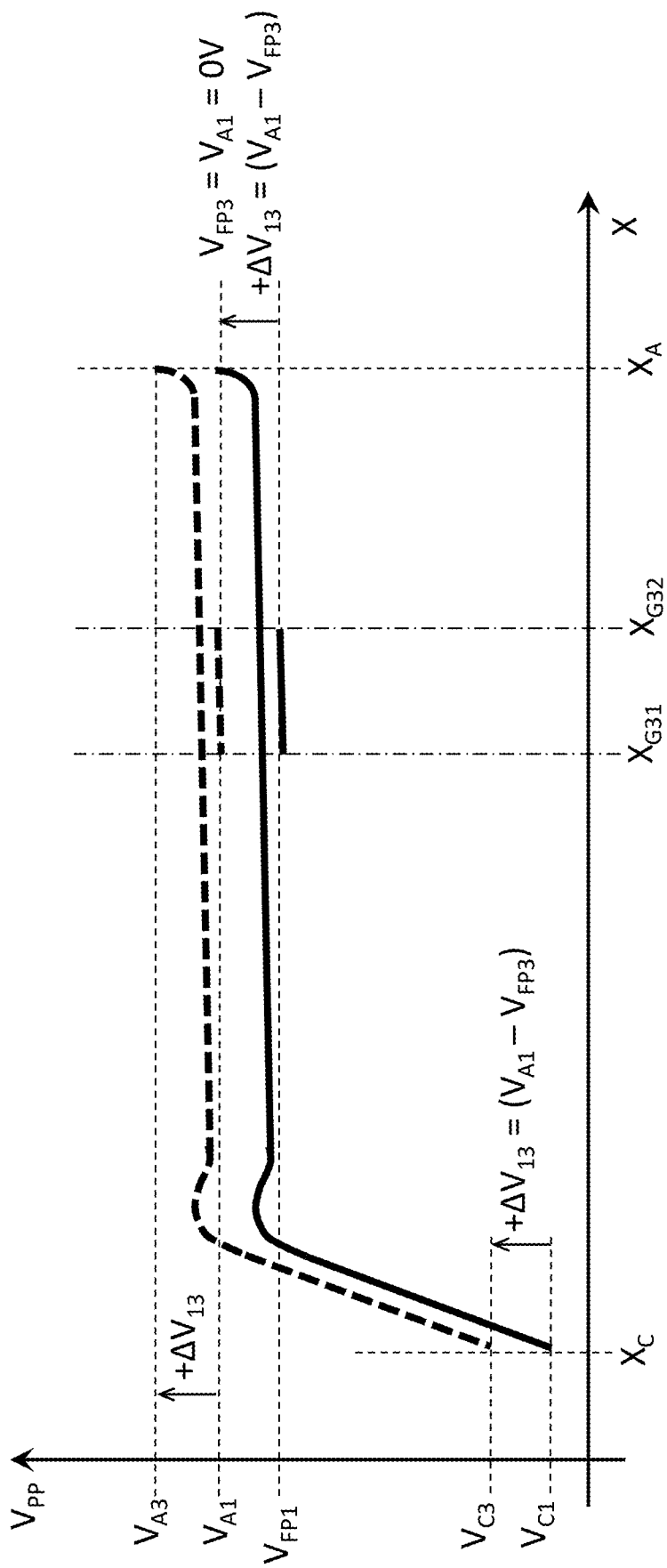
FIG. 2C shows graphs representative of adjusting the surface potential of the stage to a reference ground potential for the DC plasma processing system of FIG. 2A

FIG. 2C shows two graphs similar to the graphs described above with reference to FIG. 2B, including a specific case where the anode voltage, $V_{A1}$, is equal to zero volts (solid lines). As can be seen in FIG. 2B, the floating potential voltage for such case is equal to a negative value, $V_{FP1}$, and therefore negative with respect to (below) the plasma potential, $V_{PP}$. Furthermore, as can be seen in FIG. 2C, for a positive step increase, $+\Delta V_{13}=(V_{A1}-V_{FP1})$, of the anode potential, the floating potential can be adjusted to a value, $V_{FP3}$, that is equal to zero volts. According to an embodiment of the present disclosure, such zeroing of the floating potential, $V_{FP}$, may allow precise control of the kinetic energy of free electrons in the DC plasma to exactly (and selectively) target energy levels of atoms at the surface of a substrate (whether conductive or insulating) being processed. In other words, and with reference back to FIG. 1F, the a priori unknown floating potential that determines the energy level, $E_n$, of a nucleus of an atom targeted/selected for processing is removed by zeroing of the floating potential, $V_{FP}$. In turn, as shown in FIG. 4B later described, this allows to reference the energy level, $E_e$, of target electrons, the kinetic energy level of the free electrons in the DC plasma (e.g., $V_{KEa}$ of FIG. 1F), and the biasing voltage, $V_B$, applied to the stage, S, to the same known and fixed reference of zero volts potential, Gnd. It should be noted that although provision of a known level of the floating potential, $V_{FP}$, may be provided by zeroing such potential as described above, such zeroing should not be considered as limiting the scope of the present disclosure as other preset/adjusted non-zero values of the floating potential may equally serve as a reference potential for precise control of the kinetic energy of free electrons in the DC plasma to exactly (and selectively) target energy levels of atoms at the surface of a substrate (whether conductive or insulating) being processed.

Figure 3A:
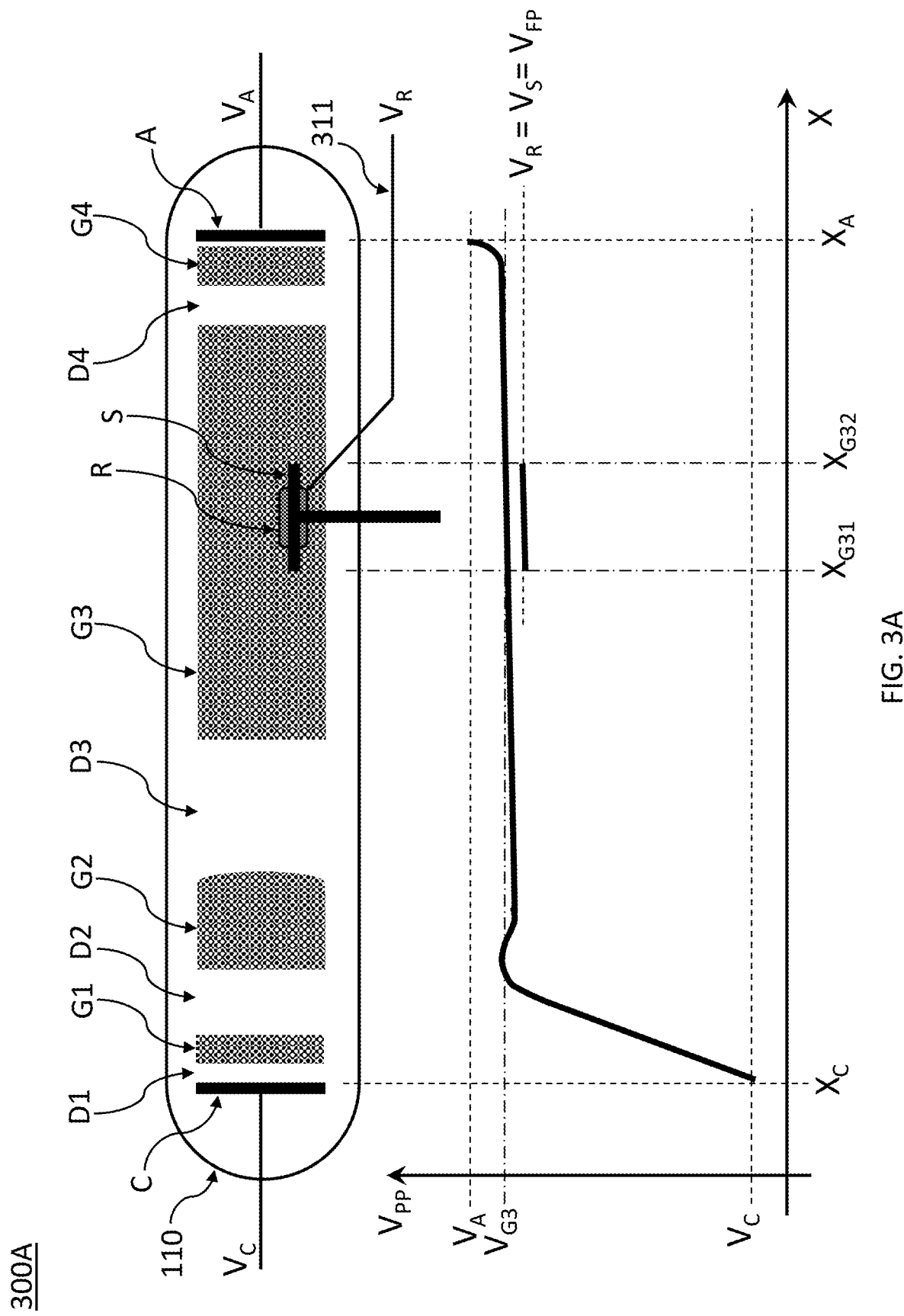
FIG. 3A shows a simplified schematic view of a DC plasma processing system according to an embodiment of the present disclosure comprising means to control a surface potential of the stage and means to measure the surface potential.

FIG. 3A shows a simplified schematic view of a DC plasma processing system (300A) according to an embodiment of the present disclosure comprising means (250, 260 of FIG. 2A) to control a surface potential of the stage, S, and means (R, 311, $V_R$ of FIG. 3A) to measure the surface potential, $V_S$ (e.g., floating potential, $V_{FP}$) atop the stage. As understood by a person skilled in the art, the system (300A) represents an improvement over the system (200A) described above with reference to FIG. 2A by adding the means (R, 311, $V_R$) to measure the surface potential, $V_S$, or in other words, to measure the (surface) floating potential, $V_{FP}$ atop the stage. By enabling such measurement of the floating potential, $V_{FP}$, adjustment of the DC voltage source (250) as described above with reference to FIGS. 2A-2C may be performed while monitoring/measuring the surface potential, $V_{FP}$. This in turn allows precise control of the floating potential, $V_{FP}$, including, for example, to zero such potential ($V_{FP}$=0 volts).

With continued reference to FIG. 3A, the means (R, 311, $V_R$) includes a reference plate, R, that is placed within DC plasma chamber (110) at a same (longitudinal coordinate) segment [$X_{G31}$, $X_{G32}$] as the stage, S. The reference plate, R, may be fabricated from any conductive material capable of withstanding (internal) operating conditions of the chamber (110), and may have any planar shape, including planar shapes according to, for example, a square, rectangle, circle, pentagon, trapezoid or other. Because the reference plate, R, is arranged in the same region of the plate, S, and therefore in a region of a same substantially constant plasma potential, $V_{PP}$, the reference plate, R, sees the same floating potential, $V_{FP}$, as the stage, S. In other words, by measuring the (surface) potential, $V_R$, at the reference plate, R, the floating potential at the stage, S, can be determined. An insulated conductive wire (311) attached to the reference plate, R, may be used to route/couple the potential, $V_R$, to measurement electronics (e.g., transducer) placed outside the chamber (110). It should be noted that such measurement electronics should not provide a DC current path to the plasma through plate R.

With continued reference to FIG. 3A, placement of the reference plate, R, may be at any longitudinal extension of the chamber (110) within the segment [$X_{G31}$, $X_{G32}$] that is technically feasible and practical. As the chamber (110) may include an access door adjacent the stage, S, on one side of the chamber (110), in some exemplary embodiments the reference plate, R, may be arranged against, or in the vicinity, of a wall of the chamber (110) that is on an opposite side of the access door and stage, S. Furthermore, according to an exemplary embodiment, a center of the reference plate, R, and a center of the stage, S, (e.g., intersection of the two segments that make the T shape of the stage as shown in the figures) may be contained within a line that is perpendicular to the axial direction (e.g., centerline, direction of longitudinal extension) of the chamber (110). Applicants of the present disclosure have verified high accuracy of the means (R, 311, $V_R$) in tracking of the floating potential of the stage, S.

Figure 3B:
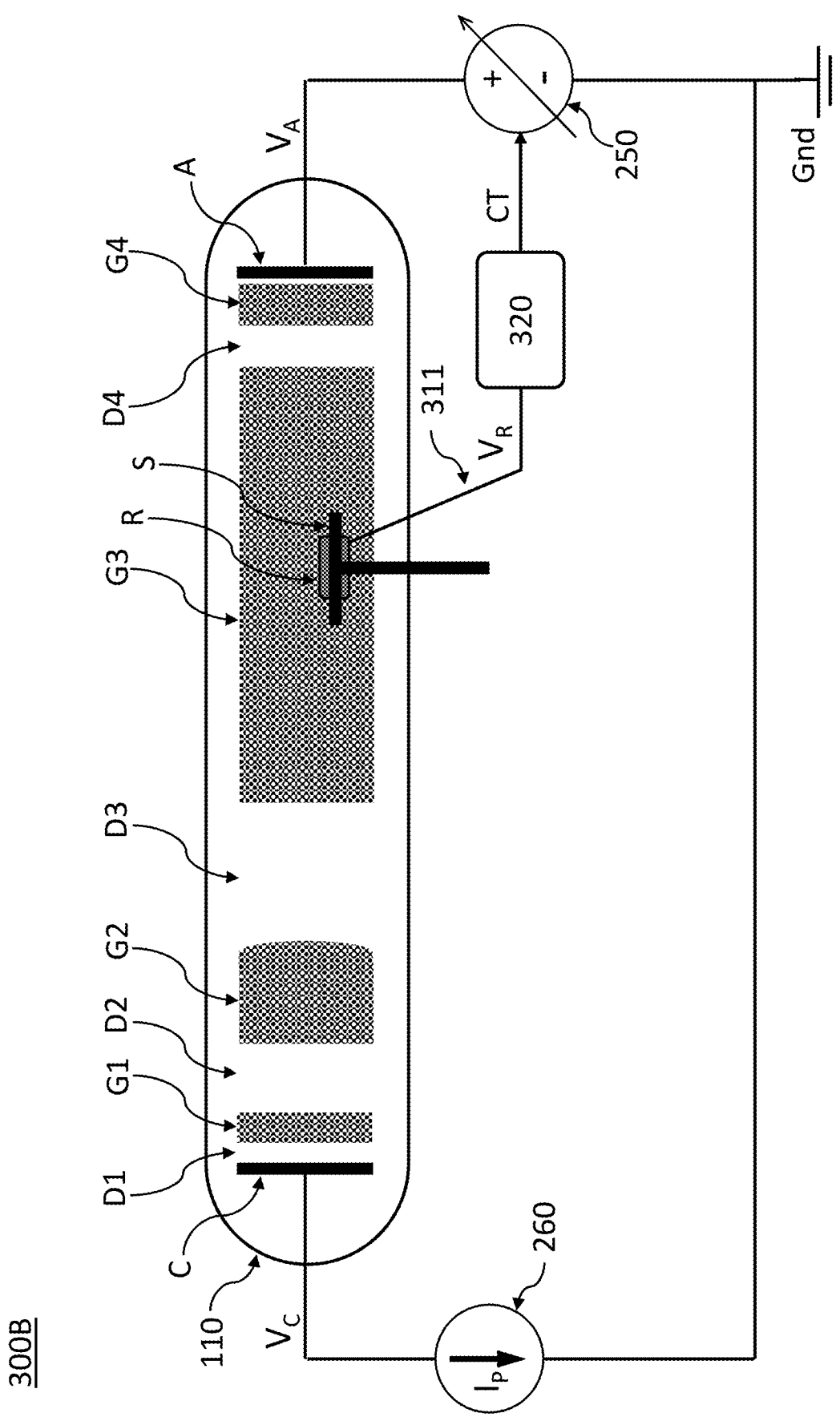
FIG. 3B shows a simplified schematic view of a DC plasma processing system according to an embodiment of the present disclosure that is based on the system of FIG. 3A with added means for automatic control of the surface potential.

FIG. 3B shows a simplified schematic view of a DC plasma processing system (300B) according to an embodiment of the present disclosure that is based on the system (300A) of FIG. 3A with added means (320, CT) for automatic control of the surface potential, $V_{FP}$, at the stage, S. The means (320, CT) includes control electronics (320) configured to implement a closed loop control system to automatically control the value of the floating potential, $V_{FP}$, at the stage, S, to a preset value (e.g., zero volts) while operating the DC plasma chamber for different types of processing. In particular, as shown in FIG. 3B, the control electronics (320) takes the (surface) potential, $V_R$, of the reference plate, R, as input via a coupling provided by the insulated conductive wire (311), and generates therefrom a control (error) signal, CT, to the adjustable DC voltage source (250) to adjust the voltage, $V_A$, provided to the anode, A, and therefore, as described above with reference to FIGS. 2A-2C, adjust the floating potential, $V_{FP}$, at the stage, S. The control (error) signal, CT, may be generated with respect to a desired target/preset value of the floating potential, $V_{FP}$, such as, for example, zero volts. A person skilled in the art is well aware of design techniques for implementing the control electronics (320) which are outside the scope of the present disclosure. In particular, a person skilled in the art is well aware of using operational amplifiers or error amplifiers in such control electronics (320), wherein inputs of such amplifiers may be coupled to the potential, $V_R$, and to the desired target/preset value (e.g., zero volts) of the floating potential, $V_{FP}$, to generate an error signal (e.g., CT) based on a difference of the inputs.

Figure 4A:
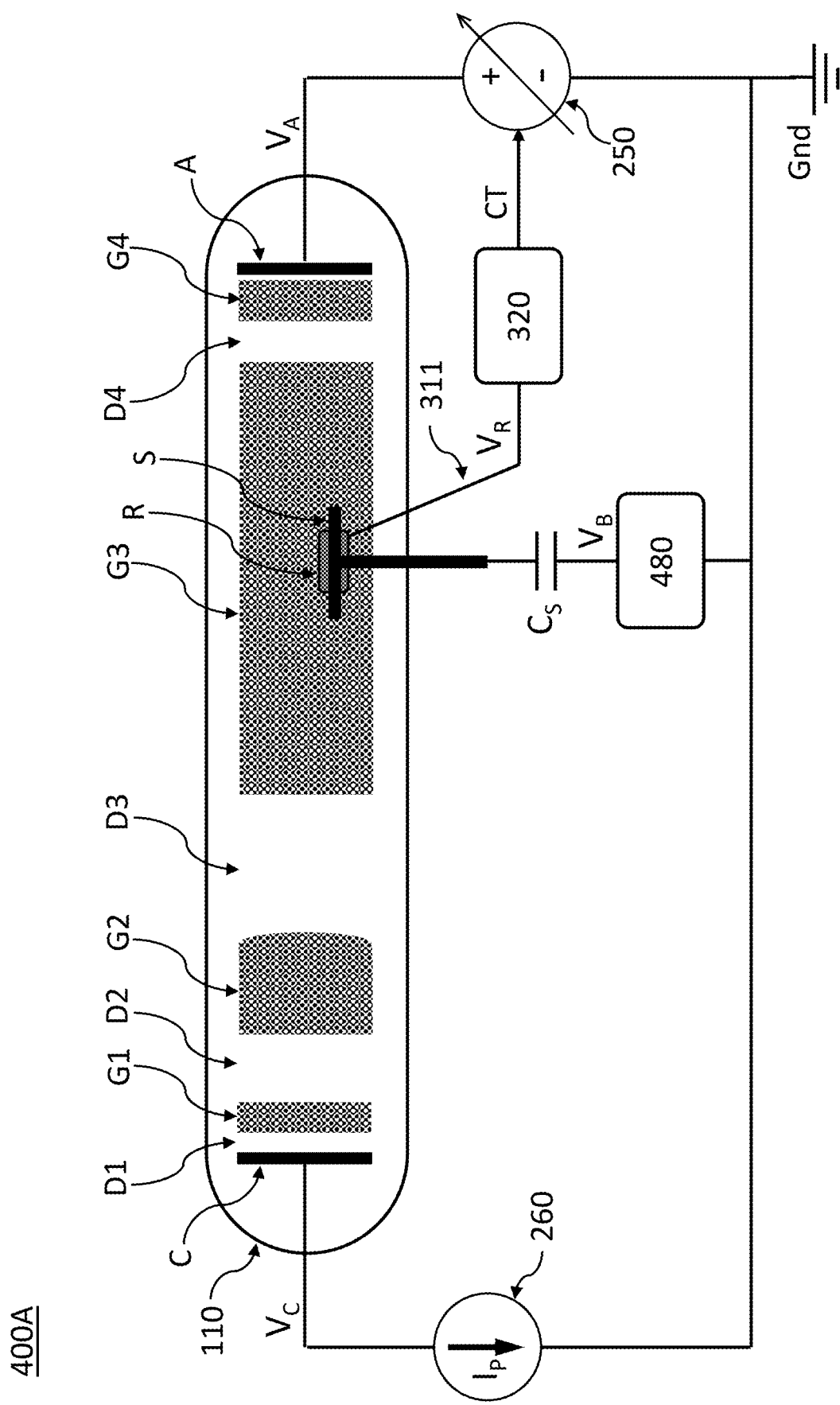
FIG. 4A shows a simplified schematic view of a DC plasma processing system according to an embodiment of the present disclosure that is based on the system of FIG. 3B with added means for biasing of the stage.
Figure 4B:
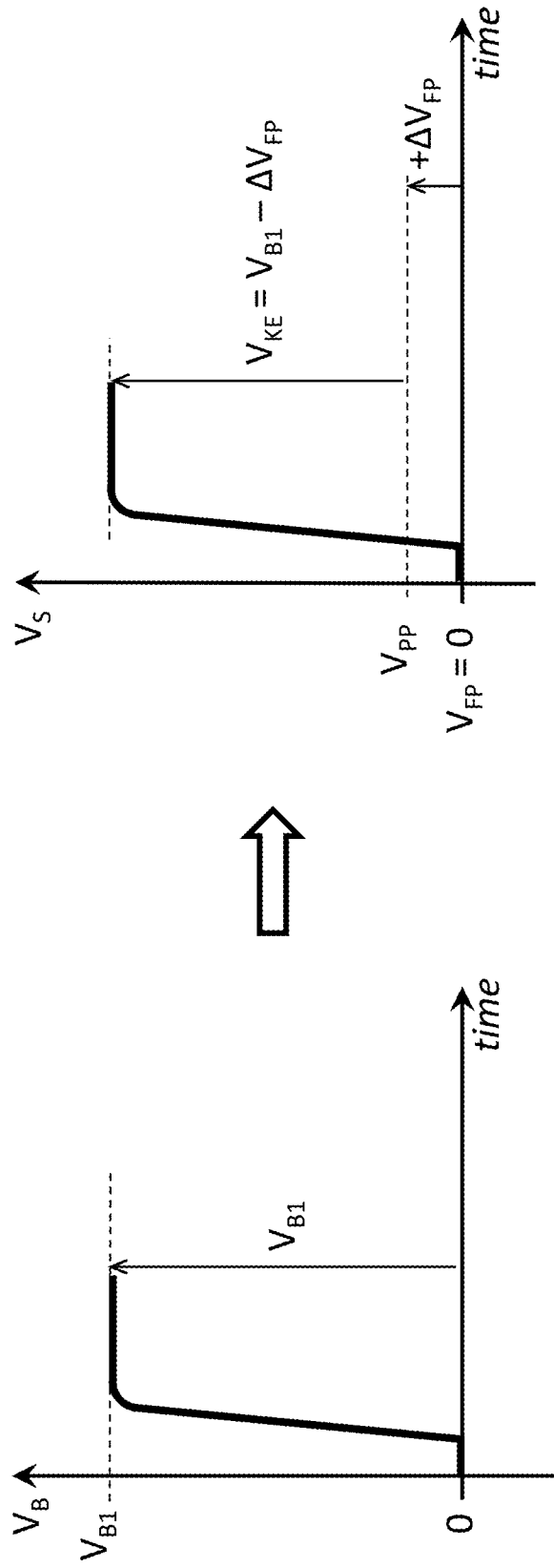
FIG. 4B shows an exemplary biasing signal provided to the stage of the DC plasma processing system of FIG. 4A and a corresponding potential generated at the surface of the stage.

FIG. 4A shows a simplified schematic view of a DC plasma processing system (400A) according to an embodiment of the present disclosure that is based on the system of FIG. 3B with added biasing means ($C_S$, 480) for biasing of the stage, S. In particular, the biasing means ($C_S$, 480) includes a biasing signal generator (480) that is coupled to the stage, S, through a capacitor, $C_S$, of the biasing means. In other words, a biasing signal, $V_B$, generated at an output of the biasing signal generator (480) is capacitively coupled to the stage, S, through the capacitor, $C_S$. As previously described in the present disclosure, such capacitive coupling may allow removal of any DC current path from or into the DC plasma chamber (110), thereby preventing any undesired perturbation of operating conditions of the chamber (110). It should be noted that the biasing signal generator (480) may include, for example, a programmable waveform generator configured to output a waveform of the biasing signal, $V_B$, according to desired characteristics, including for example, amplitude, frequency, duty cycle and/or rising/falling edges/slopes. It is further noted that the stage, S, may include a first conductive portion (e.g., vertical lead connected to the capacitor $C_S$) for electrical coupling of the biasing signal, $V_B$, to the stage, S, and a second portion of the stage (e.g., horizontal support plate) that may include conductive and/or insulating material.

FIG. 4B shows an exemplary biasing signal, $V_{B1}$, provided to the stage, S, of the DC plasma processing system (400A) of FIG. 4A and a corresponding surface potential, $V_S$, generated at the surface of the stage, S. As can be clearly understood by a person skilled in the art, the graphs shown in FIG. 4B correspond to a configuration of the system (400) wherein the floating potential, $V_{FP}$, is adjusted or controlled to be at zero volts. Accordingly, and in view of (or in contrast to) the above description with reference to FIG. 1E, the (kinetic) energy of the free electrons and/or ions attracted to the surface of the stage, S, or a substrate thereupon, is based on the potential difference $V_{KE}=(V_{B1}-\Delta V_{FP})$, with $\Delta V_{FP}=(V_{PP}-V_{FP})$. Accordingly, since in practical substrate processing applications using a DC plasma chamber, a value of $\Delta V_{FP}$ may be substantially smaller (e.g., ratio of 1/50 or smaller) than the value of $V_{KE}$ (e.g., based on the energy level $E_e$ of a target electron per FIG. 4C); an approximation $V_{KE}=V_{B1}$ may be considered reasonable. In turn, this allows a simple and straightforward generation of the biasing signal, $V_{B1}$, provided to the stage, S, for implementation of the electron enhanced material processing (EEMP) according to the teachings of the present disclosure that exactly and selectively targets the energy level of an atom (e.g., bound electron) at the surface of the substrate.

With further reference to FIG. 4A and FIG. 4B, it is noted that excitation of the energy levels of the atoms at the surface of the stage, S, or at the surface of a substrate arranged atop the stage, S, may be primarily based on an instantaneous change in the surface potential, $V_S$. Accordingly, excitation of the energy levels may be accomplished immediately at the end of the transition of the biasing voltage to the target value, $V_{B1}$, or in other words, at the end of the slope shown in FIG. 4B.

Figure 4C:
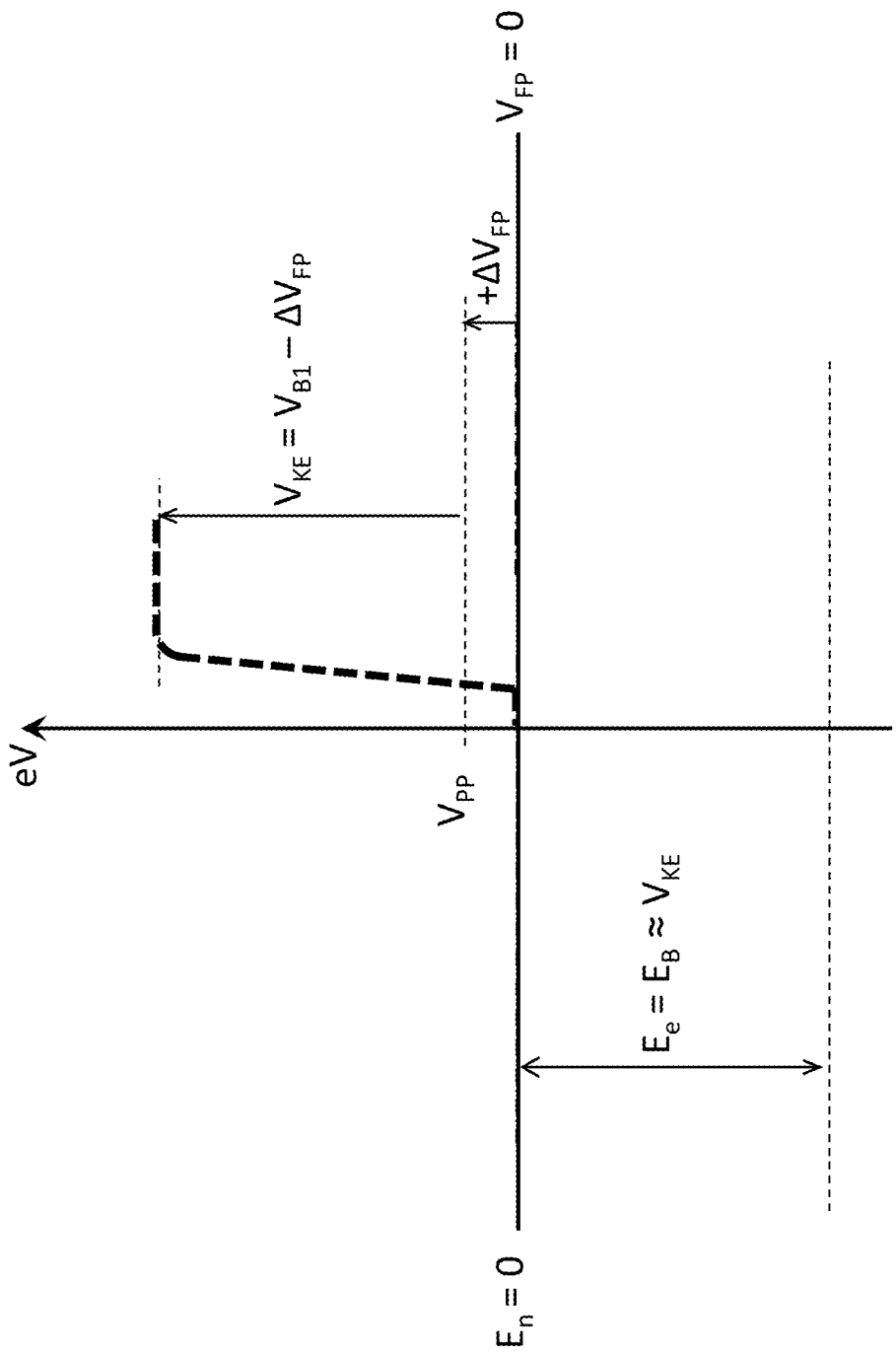
FIG. 4C shows exemplary energy levels of atoms at a surface of the stage.

FIG. 4C shows exemplary energy levels of atoms at a surface of the stage, S, of the DC plasma processing system (400A) of FIG. 4A. FIG. 4C highlights benefits of the electron enhanced material processing (EEMP) according to the teachings of the present disclosure that allows adjustments to exactly and selectively target the energy level of an atom (e.g., $E_e \approx V_{KE}$ per FIG. 4C) at the surface of the substrate based on the zeroing of the floating potential, $V_{FP}$, according the above description with reference to FIGS. 2A-2C, further based on the reference plate, R, according to above description with reference to FIG. 3A, further based on the (optional) closed loop control system provided by the control electronics (320) according to the above description with reference to FIG. 3B, and further based on the capacitive coupling of the biasing signal, $V_B$, provided by the biasing signal generator (480) according to the above description with reference to FIG. 4A.

Figure 5:
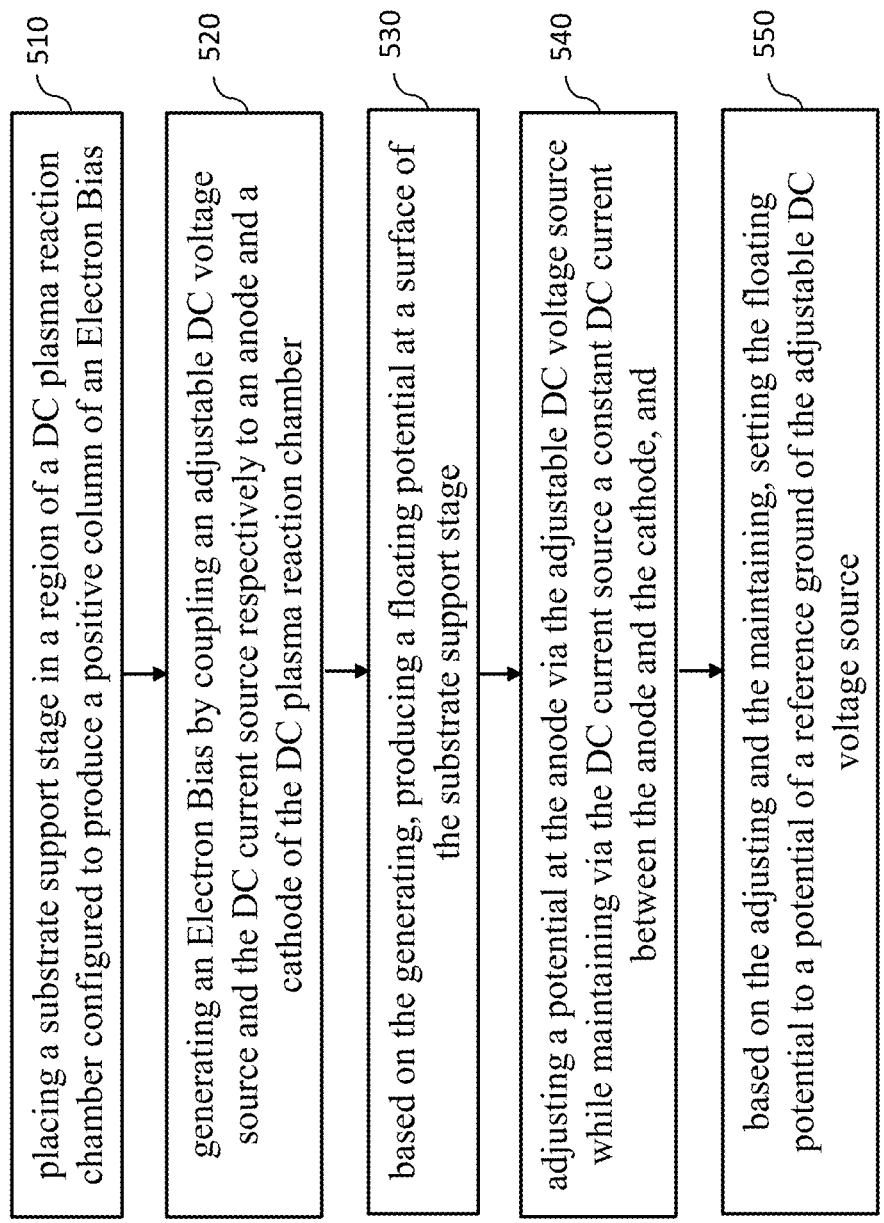
FIG. 5 is a process chart showing various steps of a method according to an embodiment of the present disclosure for processing a surface of a substrate.

FIG. 5 is a process chart (500) showing various steps of a method according to an embodiment of the present disclosure for processing a surface of a substrate. As shown in FIG. 5, such steps comprise: placing a substrate support stage in a region of a DC plasma reaction chamber configured to produce a positive column of the DC plasma, according to step (510); generating a DC plasma by coupling an adjustable DC voltage source and a DC current source respectively to an anode and a cathode of the DC plasma reaction chamber, according to step (520); based on the generating, producing a floating potential at a surface of the substrate support stage, according to step (530); adjusting a potential at the anode via the adjustable DC voltage source while maintaining via the DC current source a constant DC current between the anode and the cathode, according to step (540); and based on the adjusting and the maintaining, setting the floating potential to a potential of a reference ground of the adjustable DC voltage source, according to step (550).

Figure 6A:
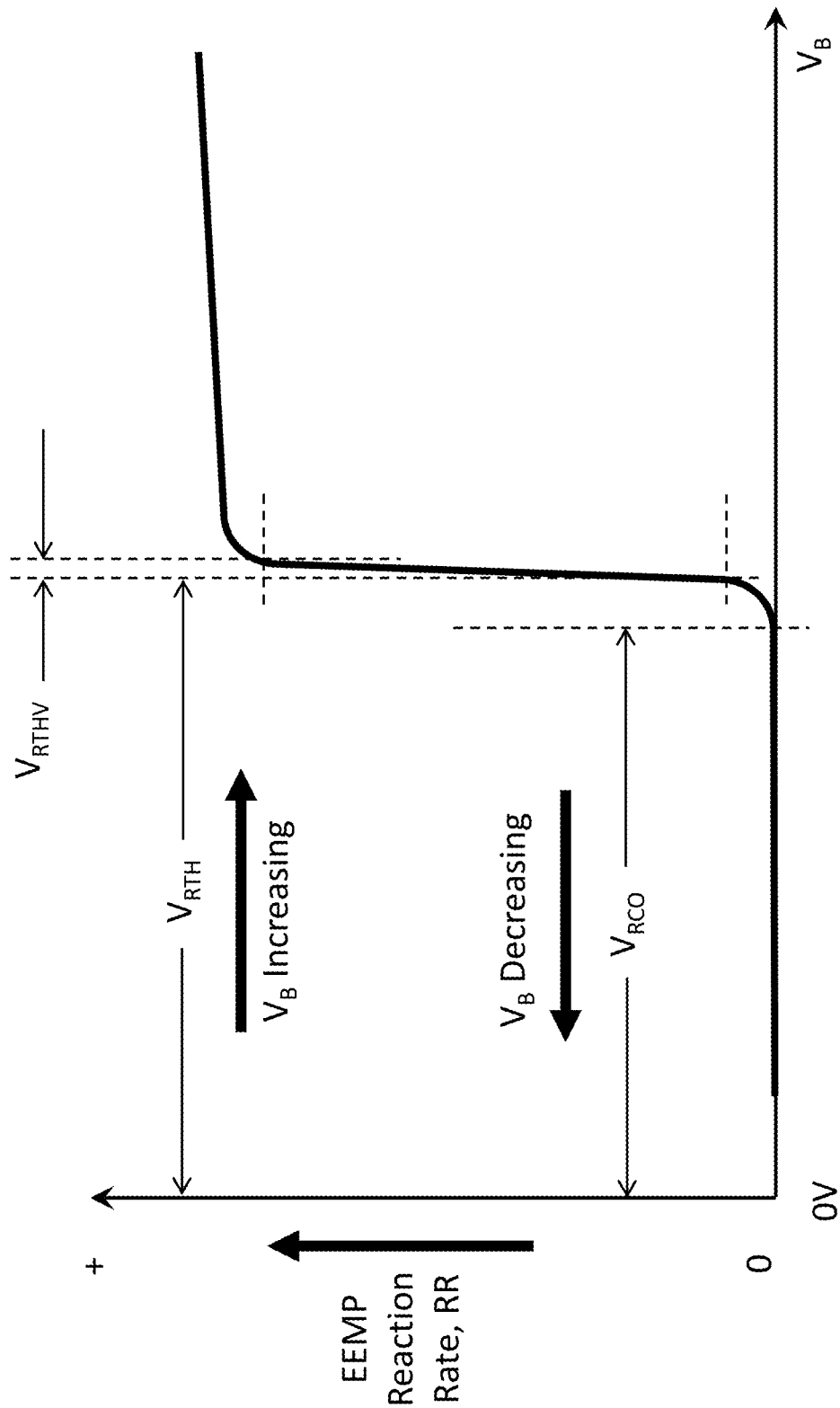
FIGS. 6A-6C show graphs representative of reaction rates of electron enhanced material processing (EEMP) according to the present disclosure for different materials.
Figure 6B:
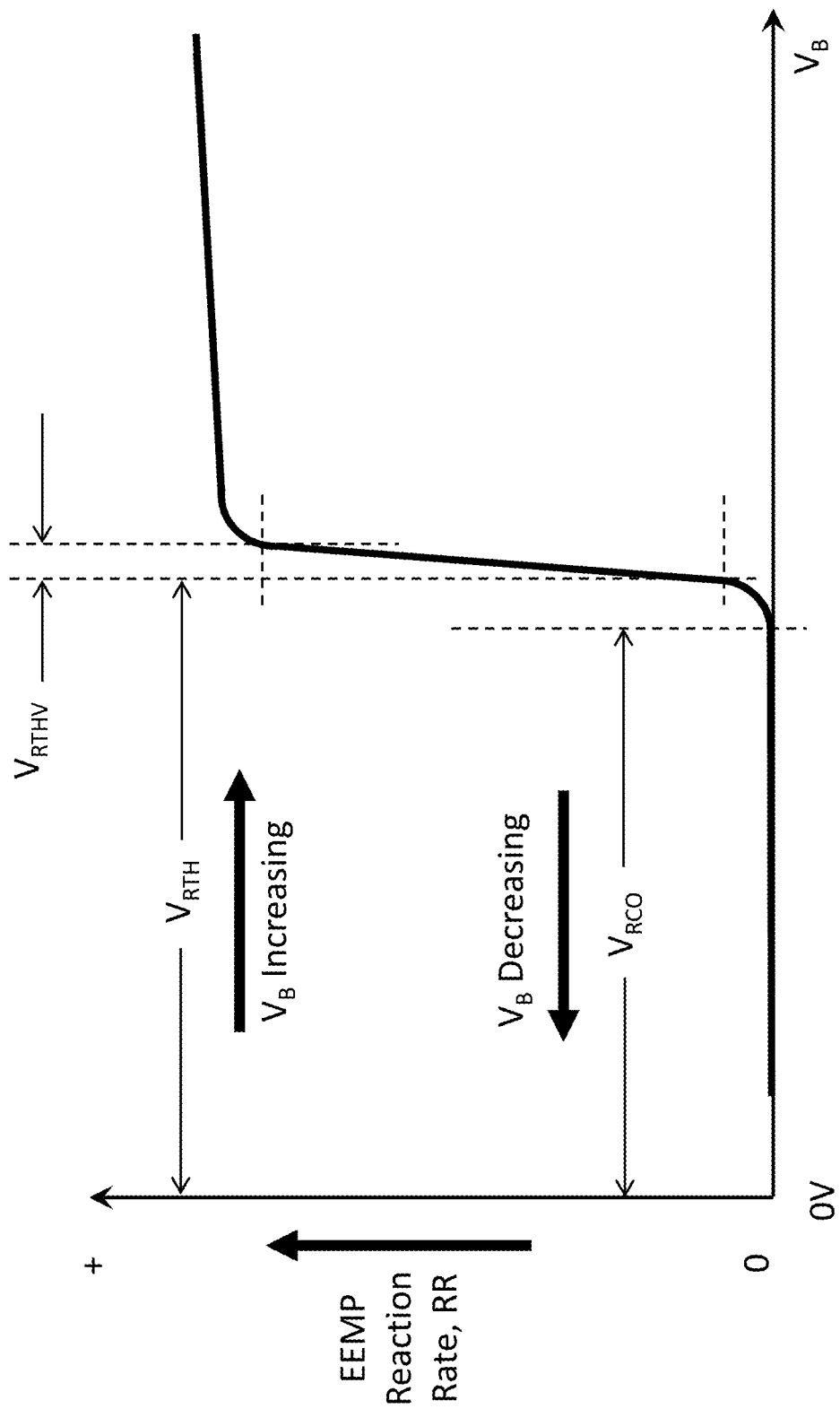
Figure 6C:
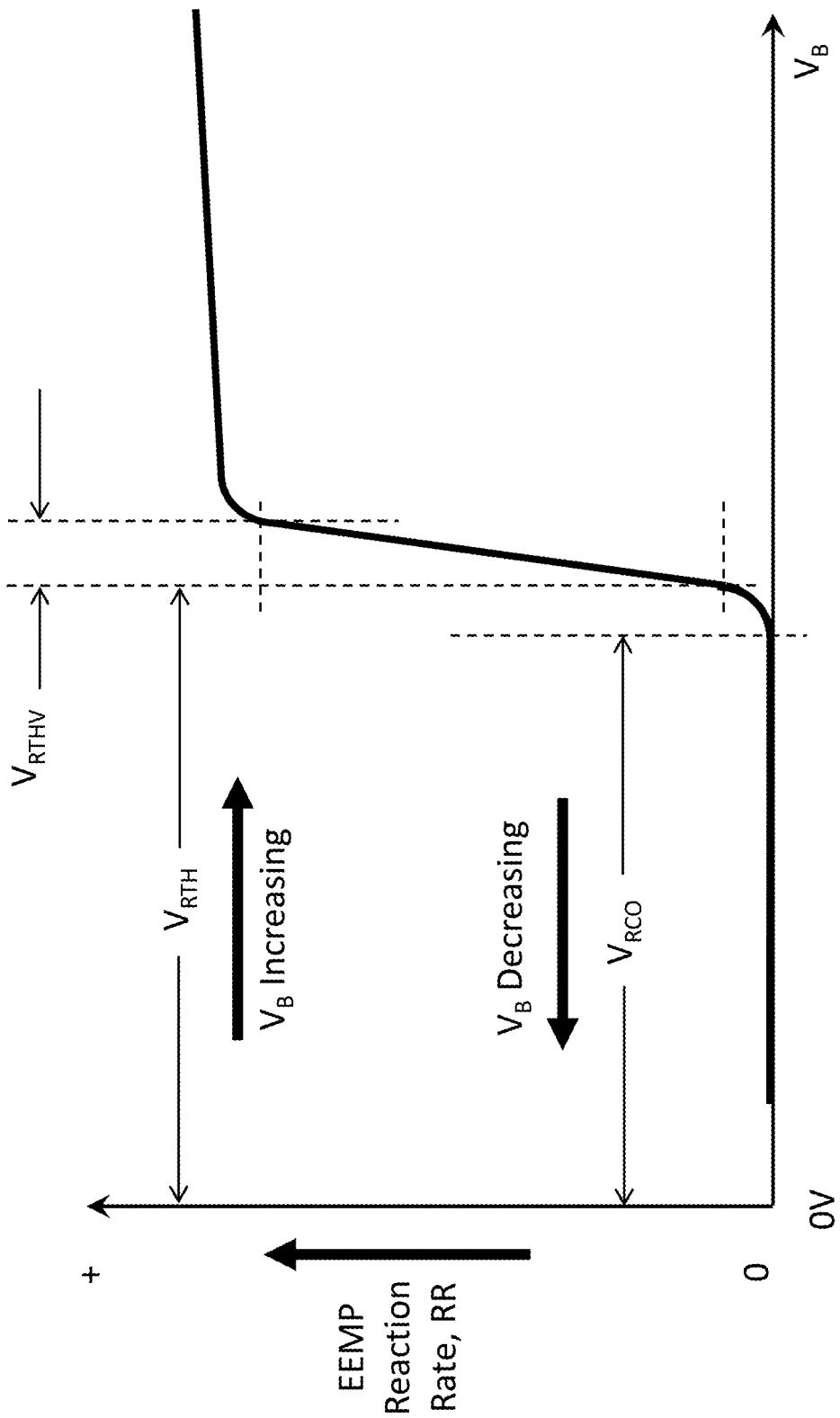

FIGS. 6A-6C show graphs representative of reaction rates of electron enhanced material processing (EEMP) according to the present disclosure for different (categories/types/classes of) materials, including, single crystal or 2-dimensional (2D) materials (FIG. 6A) such as for example a semiconductor or insulator material, metals and metal alloys (FIG. 6B), and complex materials (FIG. 6C) such as polymers, composites, nano-materials or 3-dimensional (3D) materials. In this case, a reaction, or a targeted reaction, may be referred to as the breaking of chemical bonds (e.g., bonds between electrons and nucleus) of atoms of a material at the surface of a substrate that is placed atop the stage (e.g., S of FIG. 4A) responsive to a level of the biasing signal, $V_B$, applied to the stage (e.g., S of FIG. 4A). As can be clearly taken from such graphs, the reaction rate, RR, may be characterized by a reaction threshold voltage, $V_{RTH}$, a reaction cutoff voltage, $V_{RCO}$, and a reaction threshold variation voltage, $V_{RTHV}$. It should be noted that for each material, or type of material, such characteristic voltages may be different and typically part of a priori acquired knowledge base. For example, the $V_{RTH}$ of a crystal material (e.g., FIG. 6A) may be different from the $V_{RTH}$ of a metal material (e.g., FIG. 6B) or the $V_{RTH}$ of a complex material (e.g., FIG. 6C), and the $V_{RTHV}$ of a crystal material (e.g., FIG. 6A) may be different from the $V_{RTHV}$ of a metal (e.g., FIG. 6B) or a complex material (e.g., FIG. 6C).

It should be noted that 2D materials compatible with the electron enhanced material processing (EEMP) according to the present disclosure may include, for example, graphene, boron nitride, molybdenum disulfide, tungsten diselenide, or platinum diselenide; Nano materials compatible with the EEMP according to the present disclosure may include, for example, carbon nanotubes, nano-silver particles, titanium oxide particles, or quantum dots; 3D materials compatible with the EEMP according to the present disclosure may include any 3D structure formed in a material, including for example, a polymer, collagen fiber or a metal such as, for example, titanium, or 3D printed polymer/polymer, polymer/carbon, or polymer/metal microstructures. Single crystals compatible with the EEMP according to the present disclosure may include, semi conducting single crystals, such as, for example, IV silicon, germanium, III-V gallium arsenide, gallium nitride, silicon carbide, indium gallium arsenide, etc., II-VI zinc selenide, and quantum well stacks that contain alternating layers of III-V compound semiconductors, and/or II-VI compound semiconductors. Single crystals compatible with the EEMP according to the present disclosure may further include semi conducting single crystals, such as, for example, quartz, sapphire or diamond. Polymers compatible with the EEMP according to the present disclosure may include, for example, polypropylene, polyethylene, polyether ether ketone, polycarbonate. Composites compatible with the EEMP according to the present disclosure may include, for example, polymers containing metal particles, carbon particles, carbon fibers or carbon nanotubes. Materials and structures enumerated herewith should be considered as nonlimiting with regard to a material compatibility list of the EEMP according to the present teachings, which list can grow as new materials/structures and corresponding binding and reaction energies (that can be targeted with the present EEMP) are obtained, via, for example, advanced methods for computer simulation of chemical bonds.

With continued reference to FIGS. 6A-6C, when a substrate is placed atop the stage (e.g., S of FIG. 4A), as described above with reference to, for example, FIG. 4B, the floating potential (e.g., $V_{FP}$ of FIG. 4B) may be adjusted (and controlled) to a known potential (e.g., zero volts or other). Accordingly, the energy levels of the atoms at the surface of the substrate may take the same potential (e.g., as their ground state) and no reaction at the surface of the substrate may be observed, or in other words and as shown in FIGS. 6A-6C, the reaction rate, RR, of the targeted bonds (which are at the ground state) is at zero. As the biasing voltage, $V_B$, increases, the reaction rate, RR, of the targeted bonds remains at zero, up to the reaction cutoff voltage, $V_{RCO}$, after which a small amount (e.g., minority) of the targeted bonds slowly begin to react, or in other words, a minority of the targeted bonds reach their respective excited states. As the biasing voltage, $V_B$, increases beyond the reaction cutoff voltage, $V_{RCO}$, the reaction rate, RR, slowly increases with gradually more of the targeted bonds reaching their respective excited states. When the biasing voltage, $V_B$, reaches the reaction threshold voltage, $V_{RTH}$, a majority of the targeted bonds begin to react (e.g., reach their respective excited states) and with further increase of the biasing voltage, $V_B$, the reaction rate, RR, increases according to a (substantially) fixed slope, which continues until the biasing voltage, $V_B$, reaches the reaction threshold variation voltage, $V_{RTHV}$. Between the reaction threshold voltage, $V_{RTH}$, and the reaction threshold variation voltage, $V_{RTHV}$, the reaction rate, RR, increases until (almost) all of the targeted bonds react. As shown in FIGS. 6A-6C, further increase of the biasing voltage, $V_B$, beyond the reaction threshold variation voltage, $V_{RTHV}$, marginally increases the reaction rate, RR, or in other words, to a point of "diminishing returns". On the other hand, as the biasing voltage, $V_B$, decreases, the reaction rate, RR, follows the same graphs shown in FIGS. 6A-6C. In particular, when the biasing voltage, $V_B$, decreases to a level that is below the reaction cutoff voltage, $V_{RCO}$, the reaction rate, RR, falls to zero as all of the targeted bonds at the surface of the substrate return to their respective ground states.

As can be clearly taken from the graphs shown in FIGS. 6A-6C, the (substantially) fixed slope of the reaction rate, RR, between the voltages, $V_{RTH}$ and $V_{RTHV}$, or in other words, the difference between such two voltages, may be a function of a material used in (the surface of) the substrate being processed. In particular, the difference between the voltages, $V_{RTH}$ and $V_{RTHV}$, may be due: to atomic level imperfections on surface of a single crystal material such as a, semiconductor or insulator (e.g., FIG. 6A); to atomic level imperfections on surface of a metal, metal alloy or nano-material and related grain boundaries (e.g., FIG. 6B); or to presence of 3-dimensional (3D) structures of a polymer, a composite or other 3D material (e.g., FIG. 6C). As described later in the present disclosure, teachings according to the present disclosure describe a waveform to produce a biasing signal having a voltage level, $V_B$, that is specifically targeted to the material used in the substrate such as to control activation (or deactivation) of the reaction governed by the reaction rate, RR, graphs shown in, for example, FIGS. 6A-6C. In particular, specific waveforms for each of the materials represented by the reaction rate, RR, graphs of FIG. 6A, FIG. 6B and FIG. 6C are respectively shown in FIG. 7A, FIG. 7B and FIG. 7C.

Figure 7A:
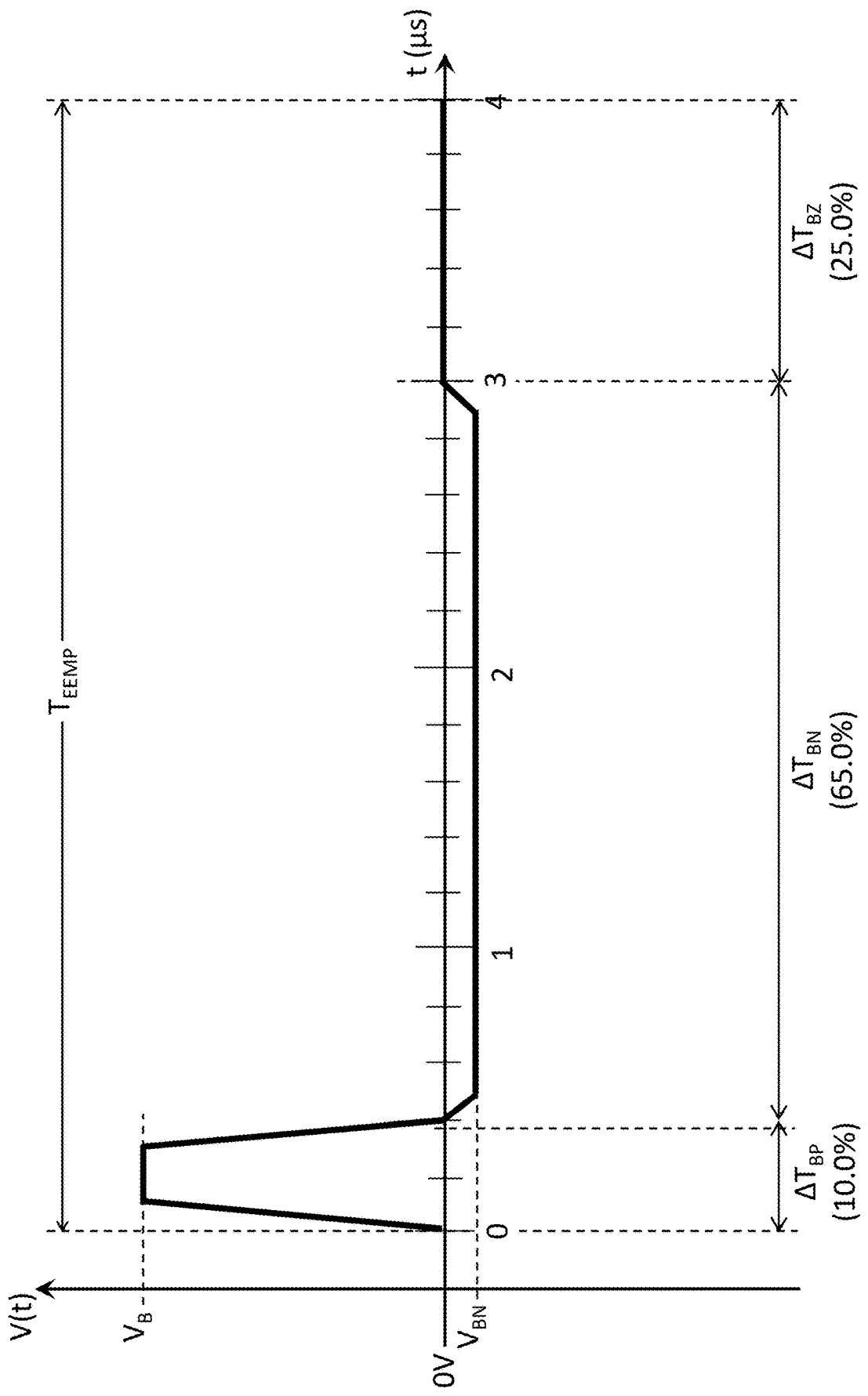
FIG. 7A-7C show graphs representative of waveforms for EEMP biasing signals according to some exemplary embodiments of the present disclosure for processing of different materials.
Figure 7B:
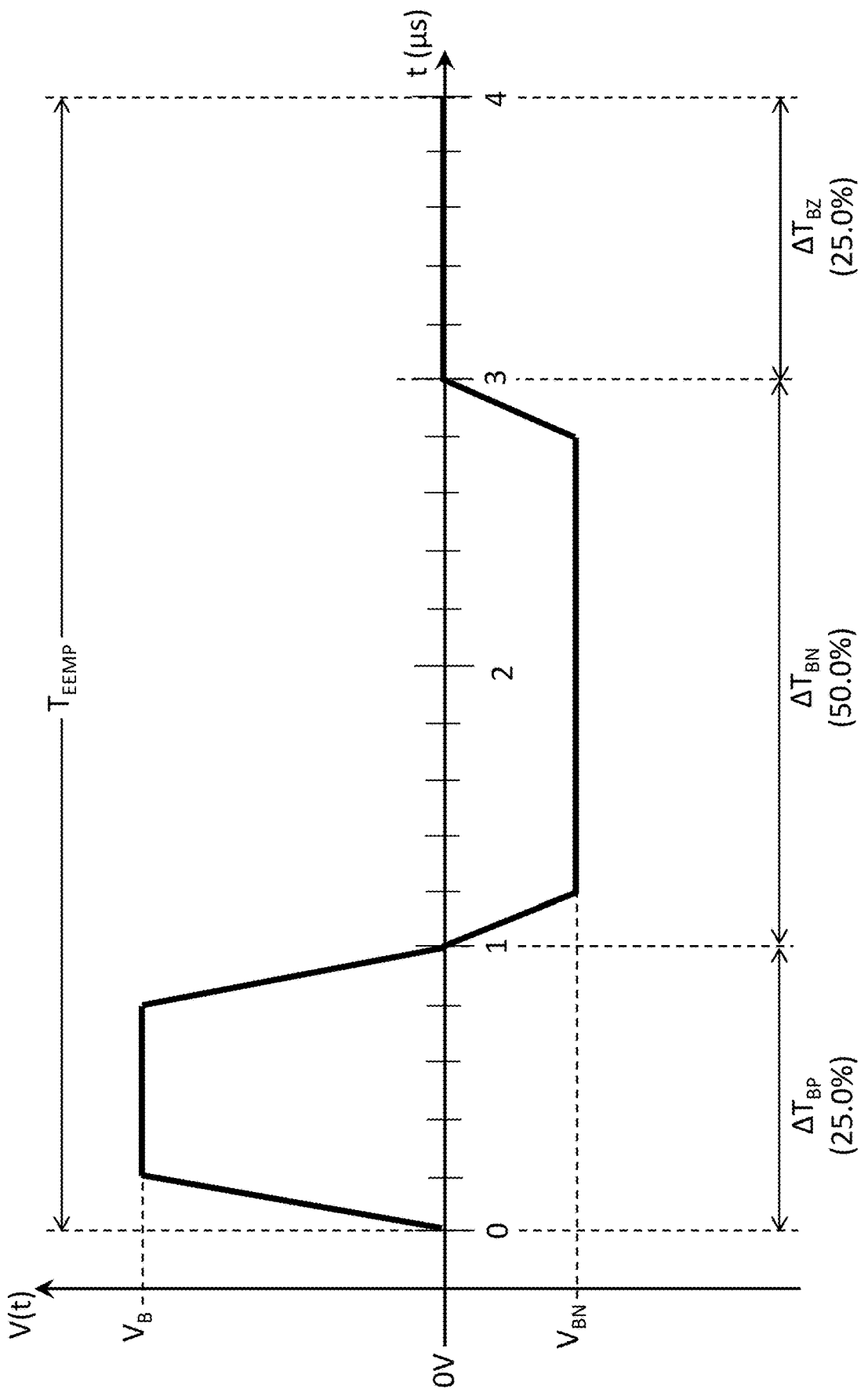
Figure 7C:
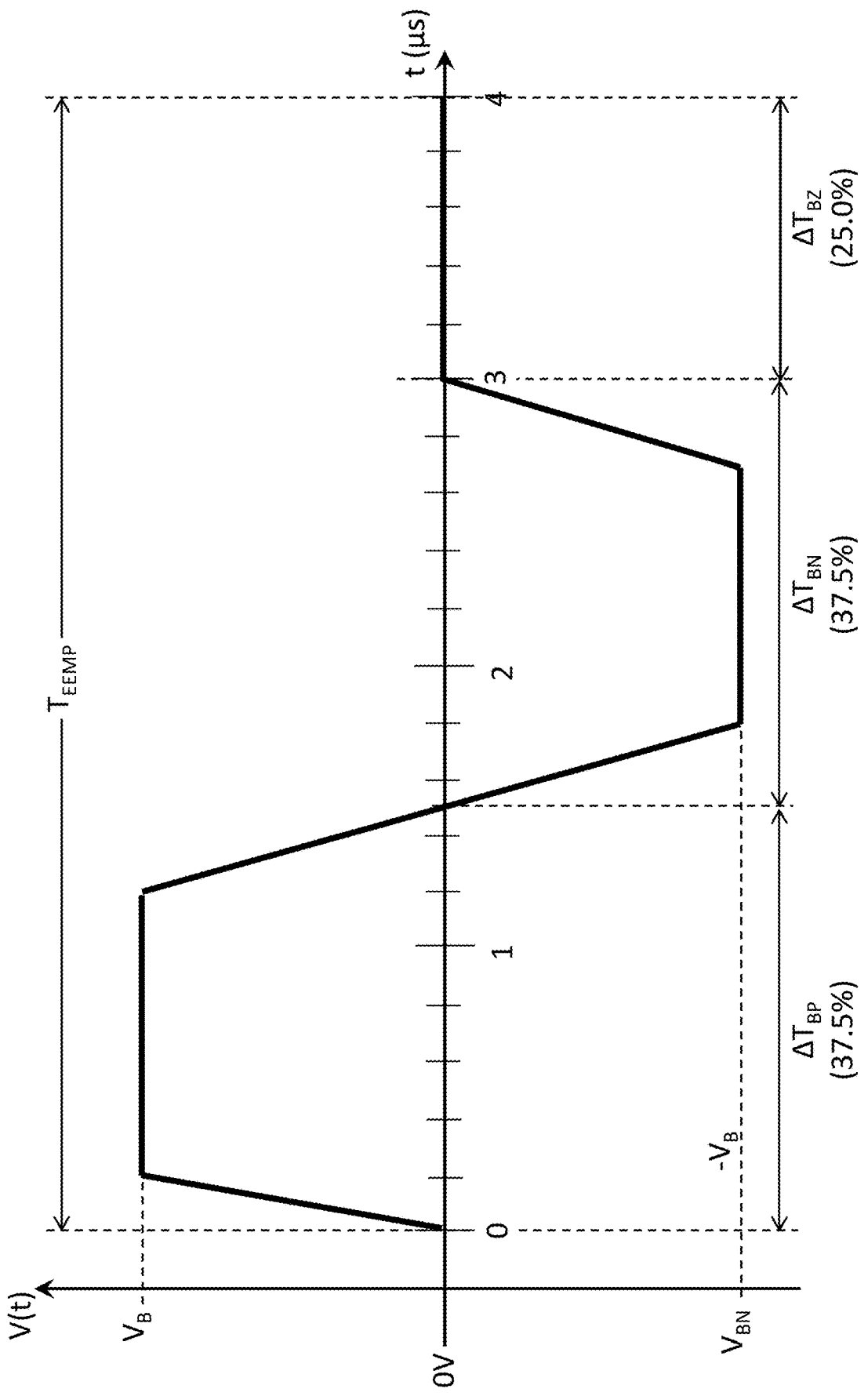

FIGS. 7A-7C show graphs representative of waveforms for EEMP biasing signals, V(t), according to some exemplary embodiments of the present disclosure for processing of different materials. In particular, FIG. 7A shows a waveform for processing of a single crystal material such as a semiconductor or insulator; FIG. 7B shows a waveform for processing of a metal, metal alloy or nano-material; and FIG. 7C shows a waveform for processing of a polymer, a composite, or a 3D material. It should be noted that such graphs represent ideal voltage levels (e.g., $V_B$, $V_{BN}$) of the biasing signal, V(t), for use in the EEMP process according to the present disclosure described above, which may include control of the potential, $V_{FP}$, to a known level, such as zero volts or other fixed known level, and energizing of free electrons in the DC plasma with voltage/potential levels (e.g., $V_B$) that are referenced to the potential, $V_{FP}$.

Each of the graphs of FIGS. 7A-7C represents one cycle, denoted as, $T_{EEMP}$, of the waveform for the (periodic) biasing signal, V(t). The EEMP processing of a material on a surface of a substrate may be performed by the biasing signal, V(t), generated via a repetition of a predetermined number of cycles, $T_{EEMP}$, according to a priori acquired process knowledge. Different EEMP processing (e.g., having respective RR characteristics) may be sequentially performed on a same substrate in view of layers of different material in the substrate and/or different operating conditions of the DC plasma reaction chamber and/or (controlled/preset) level of the potential, $V_{FP}$.

With continued reference to FIGS. 7A-7C, according to an embodiment of the present disclosure, the cycle, $T_{EEMP}$, of the waveform of the biasing signal, V(t), may include three distinct phases (e.g., time intervals, time segments), $\Delta T_{BP}$, $\Delta T_{BN}$, and $\Delta T_{BZ}$, respectively including a voltage level that is above zero volts (or the reference voltage level), below zero volts, and equal to zero volts. In other words, during the time interval, $\Delta T_{BP}$, a level, $V_B$, of the biasing signal, V(t), is strictly greater than zero volts (or the reference voltage level); during the time interval, $\Delta T_{BN}$, the level, $V_{BN}$, of the biasing signal, V(t), is strictly less than zero volts; and during the time interval, $\Delta T_{BZ}$, the level of the biasing signal, V(t), is equal to the zero volts.

According to an embodiment of the present disclosure, the duration of the cycle, $T_{EEMP}$, of the waveform shown in FIGS. 7A-7C may be in a range from 1 μs to 10 μs, or in other words, a frequency of the biasing signal, V(t), may be in a range from 100 KHz to 1 MHz. According to a further embodiment of the present disclosure, the waveform of the biasing signal, V(t), may be free of a DC component, or in other words, an integral over a cycle of the waveform shown in FIGS. 7A-7C may have a value of zero. Such DC-free characteristic of the waveform according to the present teachings may allow for maintaining an average local surface potential of the substrate during application of the biasing signal, V(t), that is (substantially) equal to the preset/controlled local surface potential (e.g., $V_{FP}$) of the substrate as described above with reference to, for example, FIGS. 2A-4C. In other words, the DC-free characteristic of the waveform may allow application of (substantially) same voltage levels (e.g., $V_B$, $V_{BN}$) shown in FIGS. 7A-7C (to free electrons) on the surface of the substrate. It should be noted that for a case where the potential $V_{FP}$ is adjusted (e.g., preset, controlled) to a (fixed and known) level that is different from zero volts, the waveform may be adjusted to include a DC component that is equal to the level of the potential $V_{FP}$, or in other words, by replacing the 0V reference in FIGS. 7A-7C with the adjusted value of the potential $V_{FP}$.

According to an embodiment of the present disclosure, length of each of the time intervals $\Delta T_{BP}$, $\Delta T_{BN}$, and $\Delta T_{BZ}$ shown in FIGS. 7A-7C may be based on the type of material (at the surface) of the substrate, including the corresponding reaction rate, RR, described above with reference to FIGS. 6A-6C. In particular, a ratio of a length of the time interval $\Delta T_{BP}$ to a length of the time interval $\Delta T_{BN}$ may be in a range from (about) 1/10 to (about) 1/1. For example, for a case of a crystal material (e.g., FIG. 7A) the ratio may be about 10/65 (+/−10%); for a case of a metal material (e.g., FIG. 7B) the ratio may be about 1/2 (+/−10%); and for a case of a complex material (e.g., FIG. 7C) the ratio may be about 1/1 (+/−10%). Furthermore, as shown in FIGS. 7A-7C, a ratio of a length of the time interval $\Delta T_{BZ}$ to a length of the entire cycle, $T_{EEMP}$, may be about ¼ (+/−10%). According to a nonlimiting embodiment of the present disclosure, the length of the time interval $\Delta T_{BZ}$ may be solely based on the length of the entire cycle, $T_{EEMP}$, and independent from respective lengths of the time intervals $\Delta T_{BP}$ and $\Delta T_{BN}$.

For an exemplary nonlimiting case shown in FIGS. 7A-7C, a ratio of the time intervals ($\Delta T_{BP}$, $\Delta T_{BN}$, $\Delta T_{BZ}$) to the length of the entire cycle, $T_{EEMP}$, may be about (e.g., +/−10%): (10/100, 65/100, 25/100) for a case of a crystal material (e.g., FIG. 7A); (25/100, 50/100, 25/100) for a case of a metal material (e.g., FIG. 7B); and (37.5/100, 37.5/100, 25/100) for a case of a complex material (e.g., FIG. 7C). It should be noted that FIGS. 7A-7C show a cycle, $T_{EEMP}$, having a length of 4 μs (frequency of 250 KHz) which should not be considered as limiting the scope of the present disclosure, since as described above in the present disclosure, such length may be in a range from 1 μs to 10 μs (e.g., frequency of 100 KHz to 1 MHz).

With continued reference to the waveform of FIGS. 7A-7C, during the phase, $\Delta T_{BP}$, the waveform may set the biasing voltage, V(t), to a (positive) level (e.g., $V_B$) for activation of the (targeted) EEMP reaction on the surface of the substrate that is based on collision of energized (free) electrons with the targeted bonds at the surface of the substrate (e.g., with a surface material comprising a single crystal for FIG. 7A, a metal for FIG. 7B, and a complex material for FIG. 7C). According to an embodiment of the present disclosure, a length during which the (high) level, $V_B$, of the biasing voltage, $V(t)$, is maintained must be long enough to hold the energized (free) electrons at the surface of the substrate to react with the targeted bonds. It should be noted that such length may not include (portion of) the rising or falling slopes contained in the phase, $\Delta T_{BP}$, shown in FIGS. 7A-7C (e.g., during which the biasing voltage (V(t) is not at the target high level, $V_B$).

Furthermore, during the phase, $\Delta T_{BN}$, the waveform of FIGS. 7A-7C may set the biasing signal, V(t), to a (negative) level, $V_{BN}$, for deactivation of the EEMP reaction on the surface of the substrate and to further discharge (e.g., repel) any free electrons from the surface of the substrate, thereby neutralizing a charge on the substrate. It should be noted that during the phase, $\Delta T_{BN}$, a kinetic energy may be imparted by the (negative) level, $V_{BN}$, of the biasing signal, V(t), to free ions in the DC plasma which may therefore cause the energized free ions to slowly move toward the surface of the substrate, thereby further participating in the neutralization of the substrate. It should further be noted that due to their low energy levels, the energized free ions may (must) not cause any reaction with bonds at the surface of the substrate. A magnitude of the voltage level, $V_{BN}$, of the basing signal, V(t), may therefore be sufficiently high (e.g., more negative) to cause the free ions to move slowly, and a duration of the phase, $\Delta T_{BN}$, may be sufficiently long to cause, in combination with the magnitude of the voltage level, $V_{BN}$, and duration of the phase, $\Delta T_{BP}$, suppression (or control) of a DC component of the biasing signal V(t).

During the phase, $\Delta T_{BZ}$, the waveform of FIGS. 7A-7C may set a voltage level of the biasing signal, V(t), to zero (or at a same preset level of the floating potential, $V_{FP}$). Accordingly, the phase, $\Delta T_{BZ}$, may be used to restore a same initial biasing condition of the substrate for the start of each cycle, $T_{EEMP}$, of the biasing signal, V(t), such initial biasing condition based on the preset level of the floating potential, $V_{FP}$. This in turn may allow for a more stable and accurate process (EEMP) when compared to other prior art processes. Accordingly, based on the provided description, each of the phases $\Delta T_{BP}$, $\Delta T_{BN}$, and $\Delta T_{BZ}$ of the cycle, $T_{EEMP}$, that describe the waveform of the biasing signal, V(t), may respectively be referred to as: an active (EEMP) reaction phase; a (EEMP) neutralization phase; and an (EEMP) initialization phase, where the latter two phases are inactive phases with respect to the targeted (EEMP) reaction.

Figure 8A:
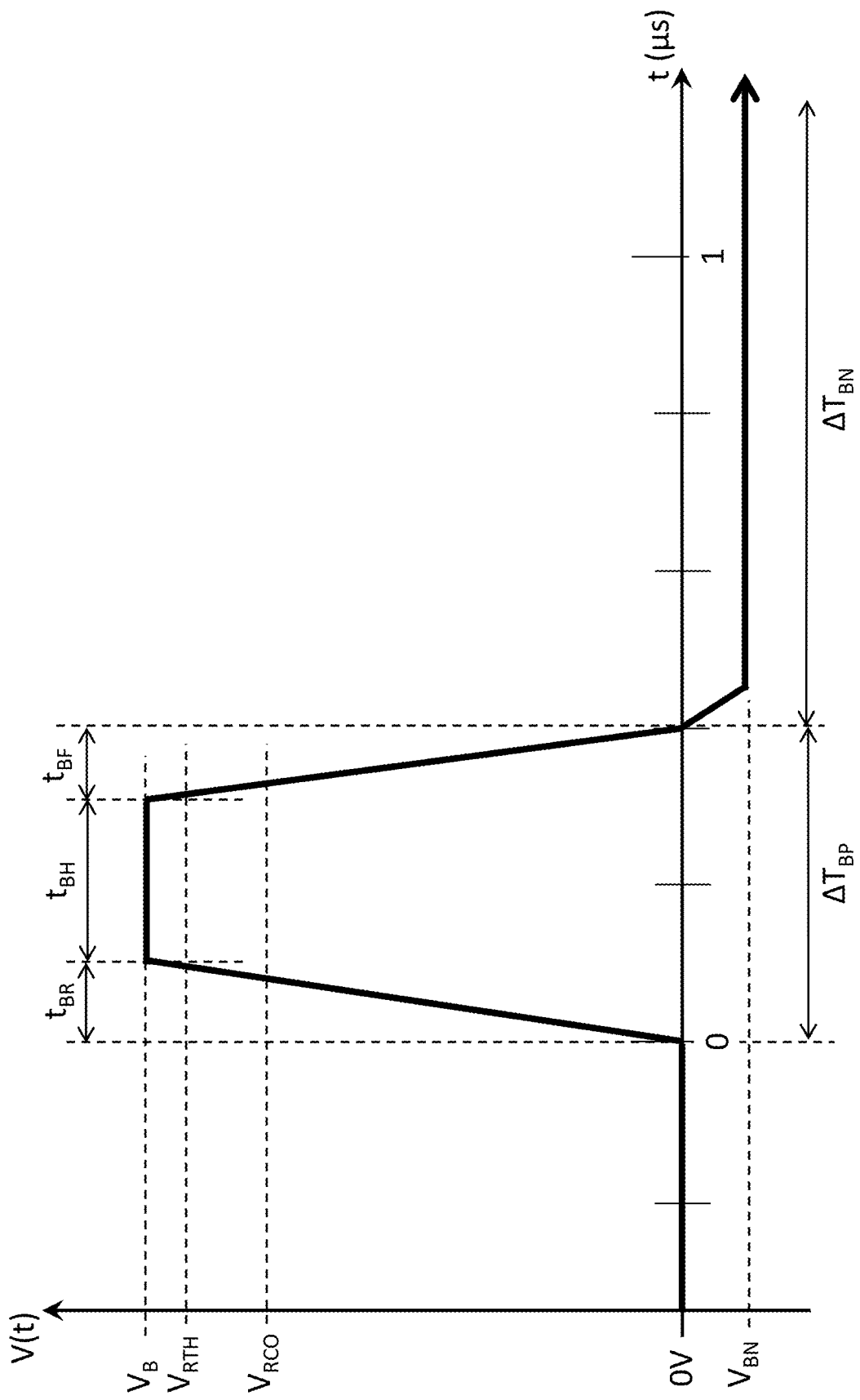
FIG. 8A shows a graph representative of an idealized waveform for the EEMP biasing signals.

FIG. 8A shows a graph representative of an idealized waveform for the EEMP biasing signals, V(t), described above with reference to FIGS. 7A-7C, including further timing details (e.g., time intervals $t_{BR}$, $t_{BH}$, and $t_{BR}$) that describe respective portions of the waveform during the active phase, $\Delta T_{BP}$. In particular, the time interval, $t_{BR}$, may define a transition duration of time that takes the biasing signal, V(t), to reach the target high level, $V_B$, from a start value (e.g., V(t)=0) at start of the phase; the time interval, $t_{BH}$, may define an effective duration of time during which the biasing signal, V(t), is at the target high level, $V_B$; and the time interval, $t_{BF}$, may define a transition duration of time that takes the biasing signal, V(t), to go back to the start value (e.g., V(t)=0) at the end of the active phase, $\Delta T_{BP}$. In other words, the time interval, $t_{BR}$, may define the rising (e.g., leading) edge slope of the biasing signal, V(t), to reach the high level, $V_B$, from the start value, and the time interval, $t_{BF}$, may define the falling (e.g., trailing) edge slope of the biasing signal, V(t), to go back to the start value.

With continued reference to FIG. 8A, during the time interval, $t_{BH}$, the biasing signal, V(t) is at the high level, $V_B$, which is above (greater than) the reaction threshold voltage, $V_{RTH}$, and therefore, as described above with reference to, for example, FIGS. 6A-6C, the targeted bonds may reach their respective excited states so long that, as described above with reference to, for example, FIGS. 7A-7C, the duration of the time interval, $t_{BH}$, is sufficiently long to hold the energized (free) electrons on the surface of the substrate to react with the targeted bonds. According to an exemplary embodiment of the present disclosure, a ratio of a length of the time interval, $t_{BH}$, to a length of the active phase, $\Delta T_{BP}$, may be in a range from about ¼ (e.g., +/−10%) to about ¾ (e.g., +/−10%). Accordingly, considering a case for EEMP processing of a single crystal material (e.g., FIG. 6A and FIG. 7A described above), with a periodic biasing signal, V(t), having a frequency of 250 KHz, and therefore a length of the cycle, $T_{EEMP}$, equal to 4 µs, then the length of the time interval, $t_{BH}$, may be in a range from about 0.1 µs to about 0.3 µs.

With further reference to FIG. 8A, as the biasing signal, V(t), rises at the start of the active phase, $\Delta T_{BP}$, a level of the biasing signal, V(t), that is above the reaction threshold voltage, $V_{RTH}$, may be reached during a portion of the time interval, $t_{BR}$. Likewise, as the biasing signal, V(t), decreases at the end of the time interval, $t_{BH}$, a level of the biasing signal, V(t), that is above the reaction threshold voltage, $V_{RTH}$, may be maintained during a portion of the time interval, $t_{BF}$. Accordingly, in an ideal case where the voltage levels shown in FIG. 8A are effectively seen by the free electrons in the DC plasma, then the portions of the time intervals, $t_{BR}$ and $t_{BF}$, where the level of the biasing signal, V(t), is above the reaction threshold voltage, $V_{RTH}$, may be included in the determination (or interpretation) of the reaction rate, RR, graphs described above with reference to FIGS. 6A-6C. However, as the rising and falling edge slopes defined by the time intervals, $t_{BR}$ and $t_{BF}$, may be very steep (high level $V_B$ can be in a range from 10 volts to about 200 volts), said portions of time may be regarded as irrelevant/insignificant when compared to a minimum amount of time required to hold the energized (free) electrons on the surface of the substrate to react with the targeted bonds.

Figure 8B:
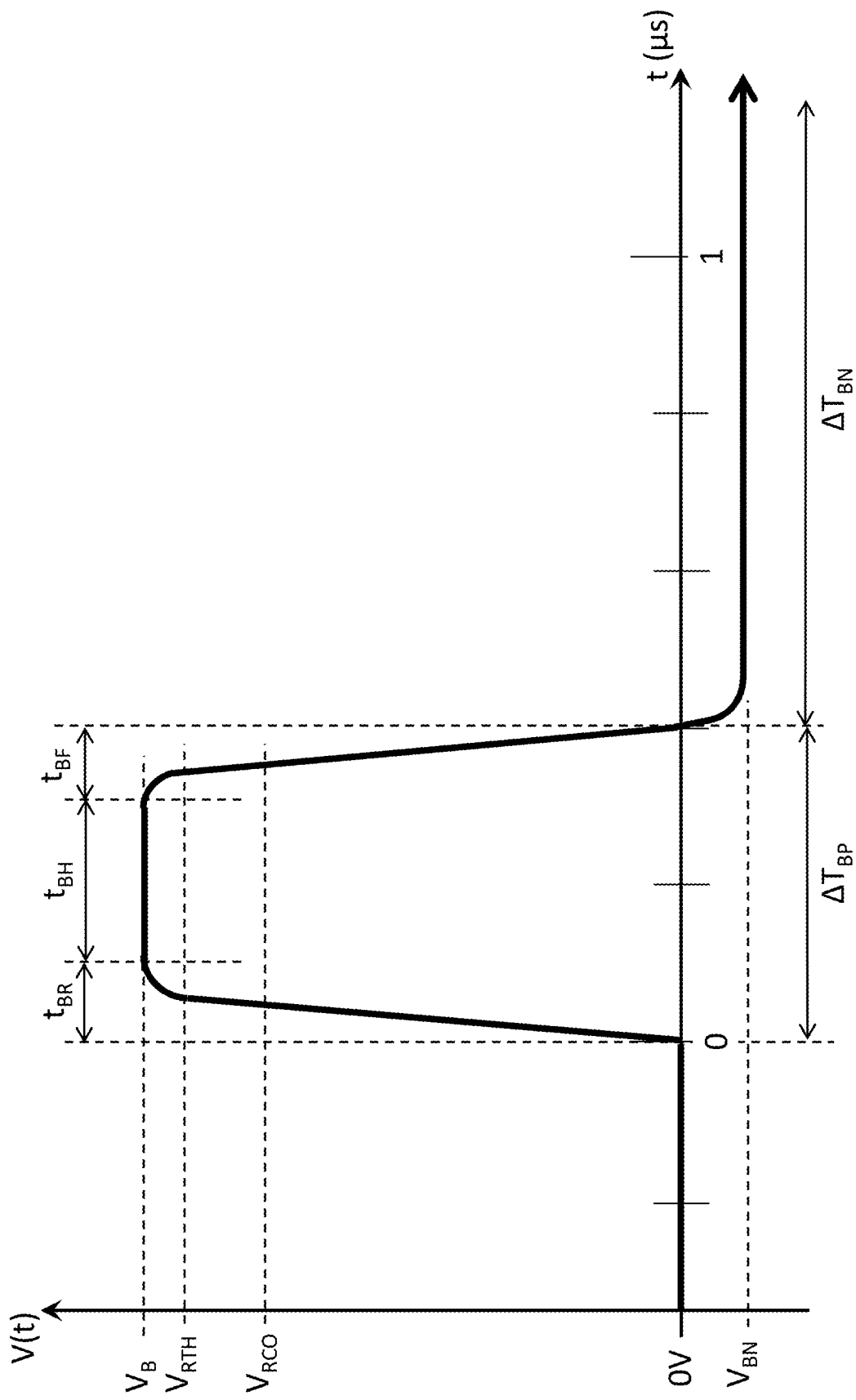
FIG. 8B shows a graph representative of a practical waveform for the EEMP biasing signals.

FIG. 8B shows a graph representative of a practical waveform for the EEMP biasing signals. Such waveform represents a practically achievable waveform that may be modelled from the ideal waveform described above with reference to FIG. 8A. In particular, the practical waveform of FIG. 8B includes gradual and curved transitions to/from corresponding steady state levels (e.g., $V_B$, $V_{BN}$, zero volts) as shown in the figure. Such practical waveform may be generated by an electronic instrument, that may include a power amplifier (e.g., such as for example, coupled to or part of, the biasing signal generator of FIG. 4A), whose output is coupled to a load under perfect matching conditions. However, such perfect matching conditions may not be provided by the capacitive load (e.g., stage S of FIG. 4A) in the DC plasma processing according to the present disclosure, and therefore, as shown in FIG. 8C, signal reflections and related distortions may be expected, including ringing, prior to settling to the steady state levels (e.g., $V_B$, $V_{BN}$, zero volts).

Figure 8C:
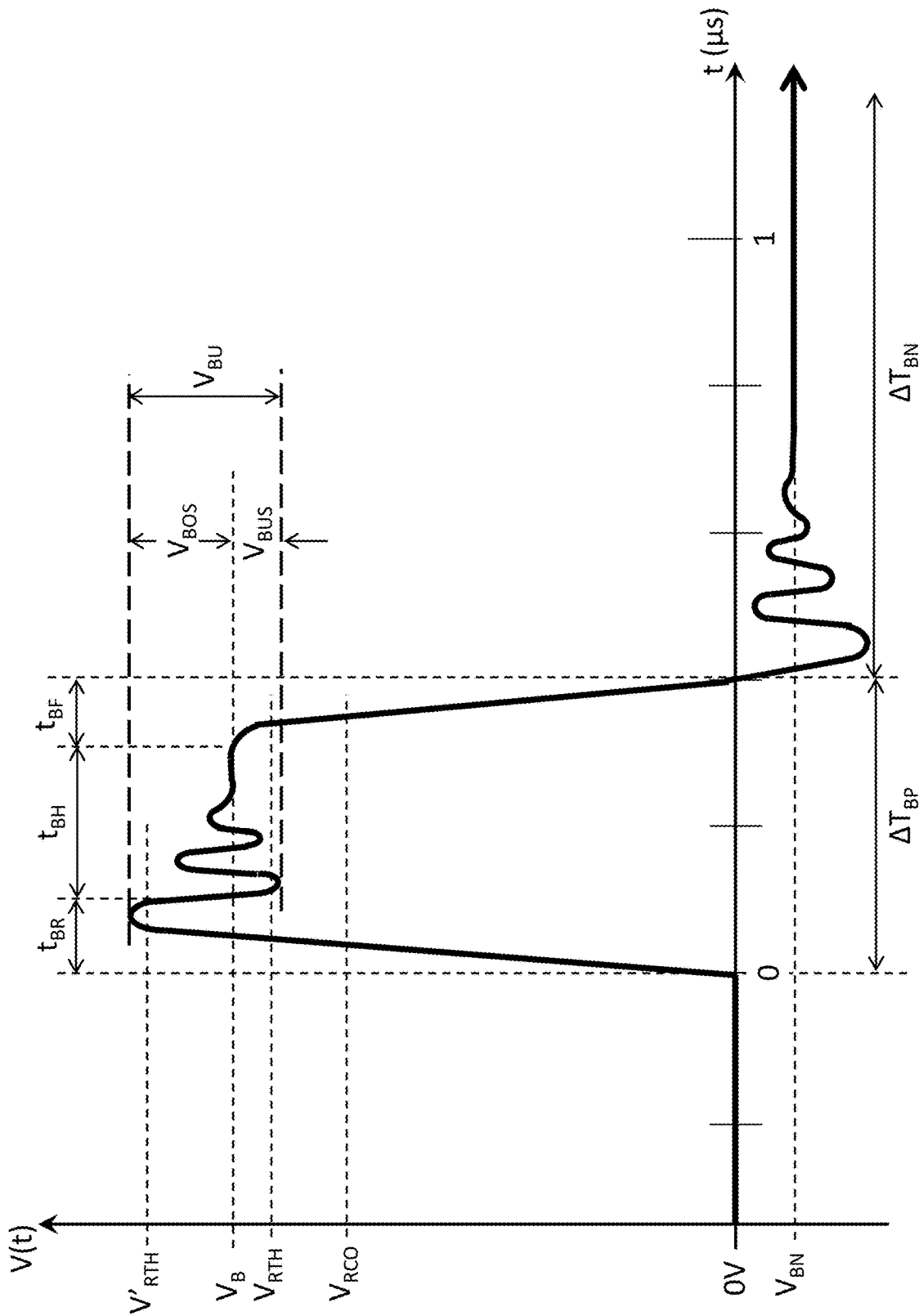
FIG. 8C shows a graph representative of an analog waveform under capacitive loading conditions.

The ringing shown in FIG. 8C may include ringing (e.g., $V_{BU}$) of the biasing signal, V(t), during the active phase, $\Delta T_{BP}$, prior to settling to the target high level, $V_B$, as well as during the neutralization phase, $\Delta T_{BN}$, prior to settling to the target low level, $V_{BN}$. As shown in FIG. 8C, the ringing during the active phase, $\Delta T_{BP}$, may be represented by an uncertainty voltage spread, $V_{BU}$, that extends above the target high level, $V_B$, by an overshoot voltage, $V_{BOS}$, and extends below the target high level, $V_B$, by an undershoot voltage, $V_{BUS}$. A person skilled in the art will clearly realize that the uncertainty voltage spread, $V_{BU}$, may perturb activation of the EEMP targeted reaction during the active phase, $\Delta T_{BP}$, as the undershoot voltage, $V_{BUS}$, may cause a level of the biasing signal, V(t), to fall below the reaction threshold voltage, $V_{RTH}$, and the overshoot voltage, $V_{BOS}$, may cause a level of the biasing signal, V(t), to reach a reaction threshold voltage, $V_{RTH}$, of non-targeted bonds that may be present at the surface of the substrate. On the other hand, the ringing during the neutralization phase, $\Delta T_{BN}$, may not noticeably affect the EEMP process as the free ions are held well below the reaction energy for any ion driven reactions (e.g., thermal chemistry reactions). According to an embodiment of the present disclosure, a reduction of the ringing shown in FIG. 8C, including the ringing during the active phase, $\Delta T_{BP}$, may be provided by predistortion (e.g., distortion compensation) of the biasing signal, V(t).

Figure 9A:
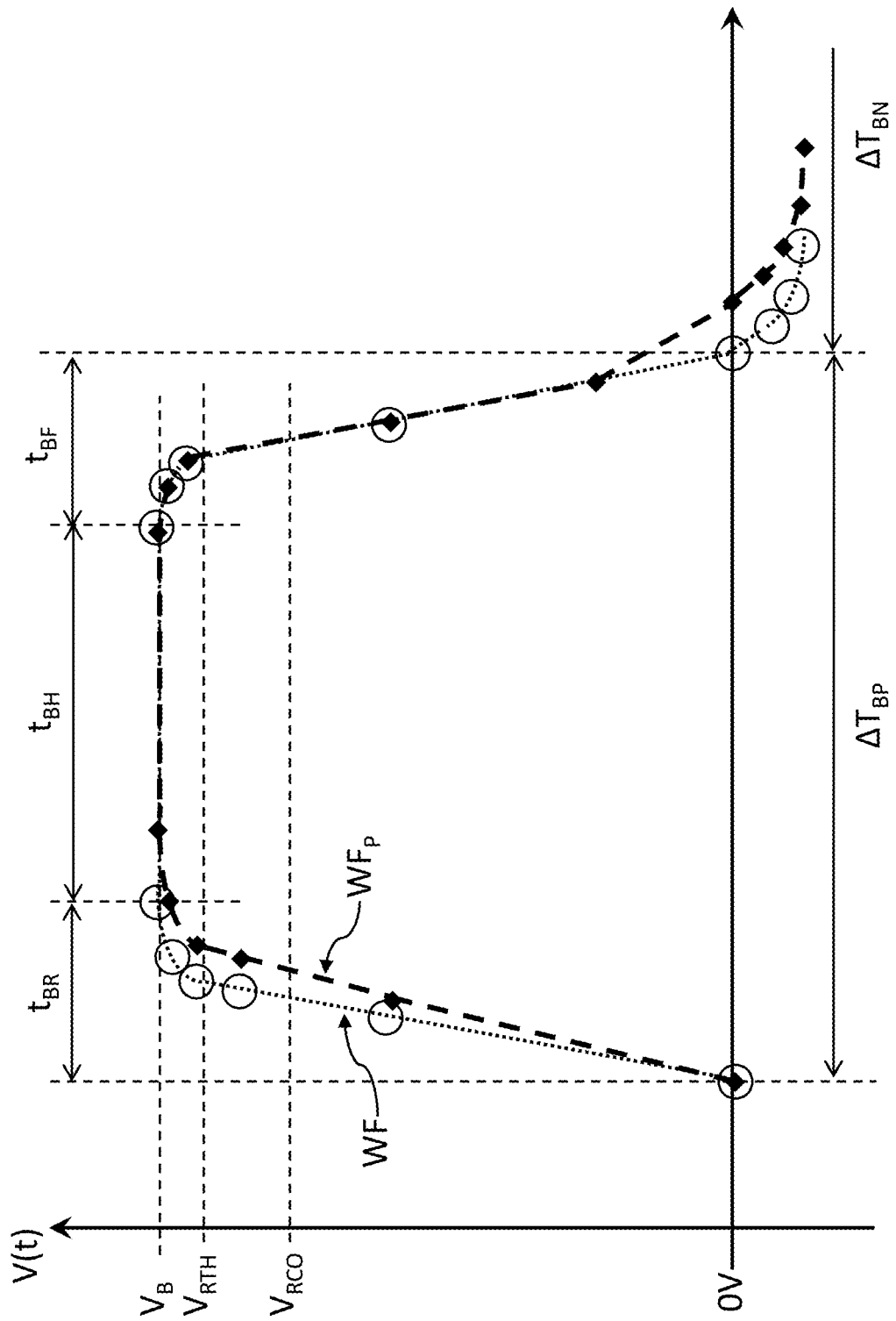
FIG. 9A shows graphs representative of a digitized waveform for generation of the practical waveform of FIG. 8B, and a corresponding digitized waveform with predistortion.

FIG. 9A shows graphs representative of a digitized waveform (WF, digital samples marked by circles) for generation of the practical waveform of FIG. 8B, and a corresponding digitized waveform with predistortion ($WF_P$, digital samples marked by squares). In particular, generation of the practical waveform of FIG. 8B may be provided by uploading corresponding digital samples of the digitized waveform, WF, to a digital signal generator whose output may be provided to a power amplifier (e.g., such as for example, coupled to or part of, the biasing signal generator of FIG. 4A). Likewise, generation of a corresponding practical waveform with predistortion may be provided by uploading the digital samples of the digitized waveform with predistortion, $WF_P$, to the digital signal generator.

Figure 9B:
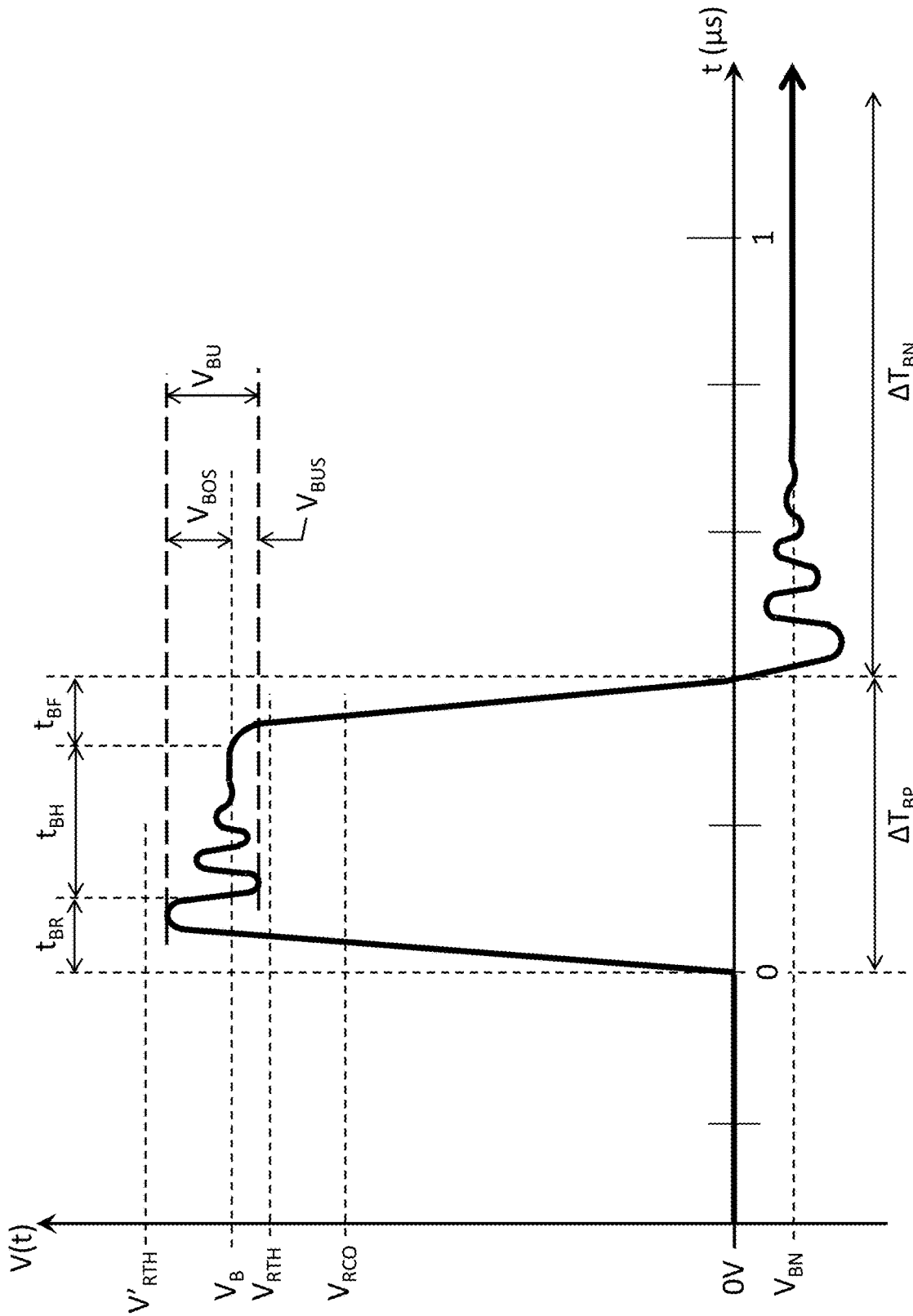
FIG. 9B shows a graph representative of an analog waveform generated from the digitized waveform with predistortion of FIG. 9A under capacitive loading conditions.

With continued reference to FIG. 9A, predistortion may be used to alter/equalize the slopes/transitions of the digitized waveform with predistortion, $WF_P$, such as to generate a practical pre-distorted waveform (e.g., $WF_P$) that when subjected to the capacitive loading conditions of the stage (e.g., S of FIG. 4A), as shown in FIG. 9B, a reduction in the amount of ringing may be provided. As shown in FIG. 9B, use of the predistortion may cause a reduction of the uncertainty voltage spread, $V_{BU}$, such as during the entire active phase, $\Delta T_{BP}$, a level of the biasing signal, V(t), may remain above the targeted reaction threshold voltage, $V_{RTH}$, and below any non-targeted reaction threshold voltage, $V_{RTH}$. It should be noted that such predistortion may result in a waveform that includes a desired length of the time interval, $t_{BH}$, during which the biasing signal, V(t), is at the target high level, $V_B$. In other words, the predistortion may preserve the length of the time interval, $t_{BH}$, described above with reference to, for example, FIG. 8A.

Figure 10A:
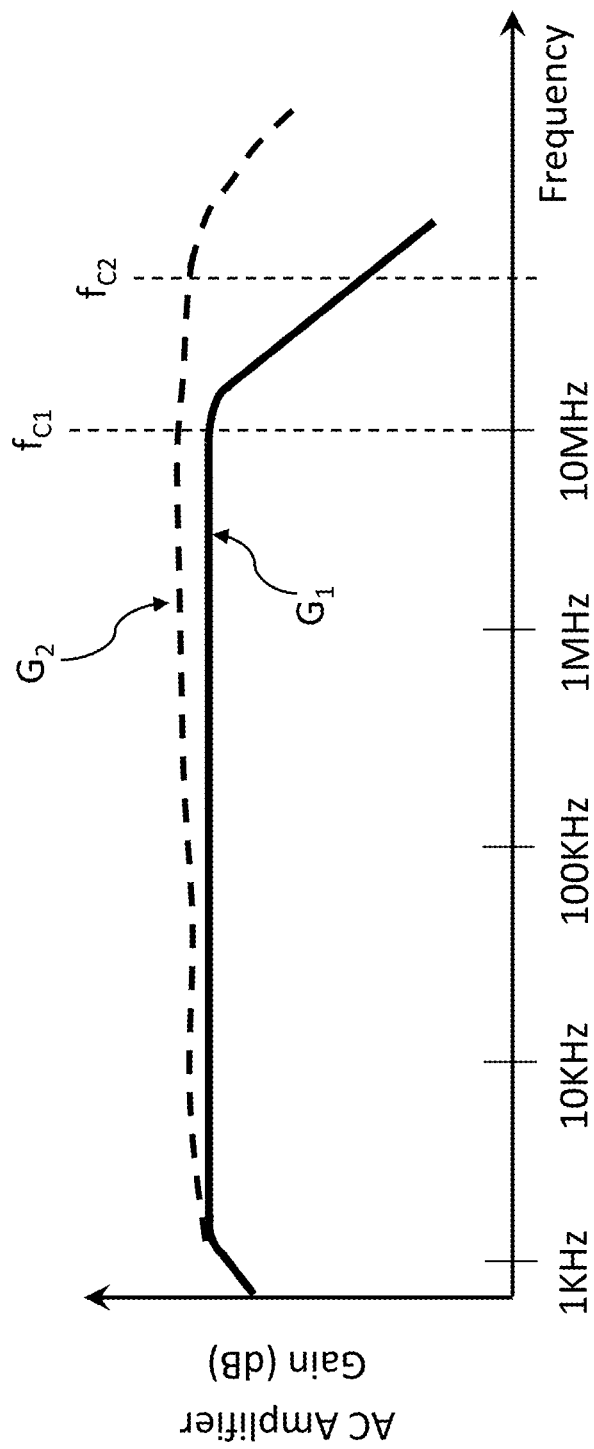
FIG. 10A shows graphs representative of gain versus frequency of a band-limited linear power amplifier according to an embodiment of the present disclosure and a gain versus frequency of a conventional power amplifier.

FIG. 10A shows graphs representative of gain versus frequency (e.g., graph $G_1$) of a band-limited linear power amplifier according to an embodiment of the present disclosure and a gain versus frequency (e.g., graph $G_2$) of a conventional power amplifier. According to an embodiment of the present disclosure, the bandlimited linear power amplifier used for the EEMP processing, may include a gain, $G_1$, that is flat within 0.75 dB in a frequency range from 10 KHz to 10 MHz as shown in FIG. 10A. Such operating (passband) range of the bandlimited linear power amplifier is selected in view of the 100 KHz to 1 MHz frequency range of operation of the biasing signal, V(t), such as to reduce any corresponding (higher frequency) harmonics that may be reflected from the capacitive load and generate distortion of the signal, including portion of the ringing (e.g., the uncertainty voltage spread, $V_{BU}$) shown in FIG. 8C and FIG. 9B.

Figure 10B:
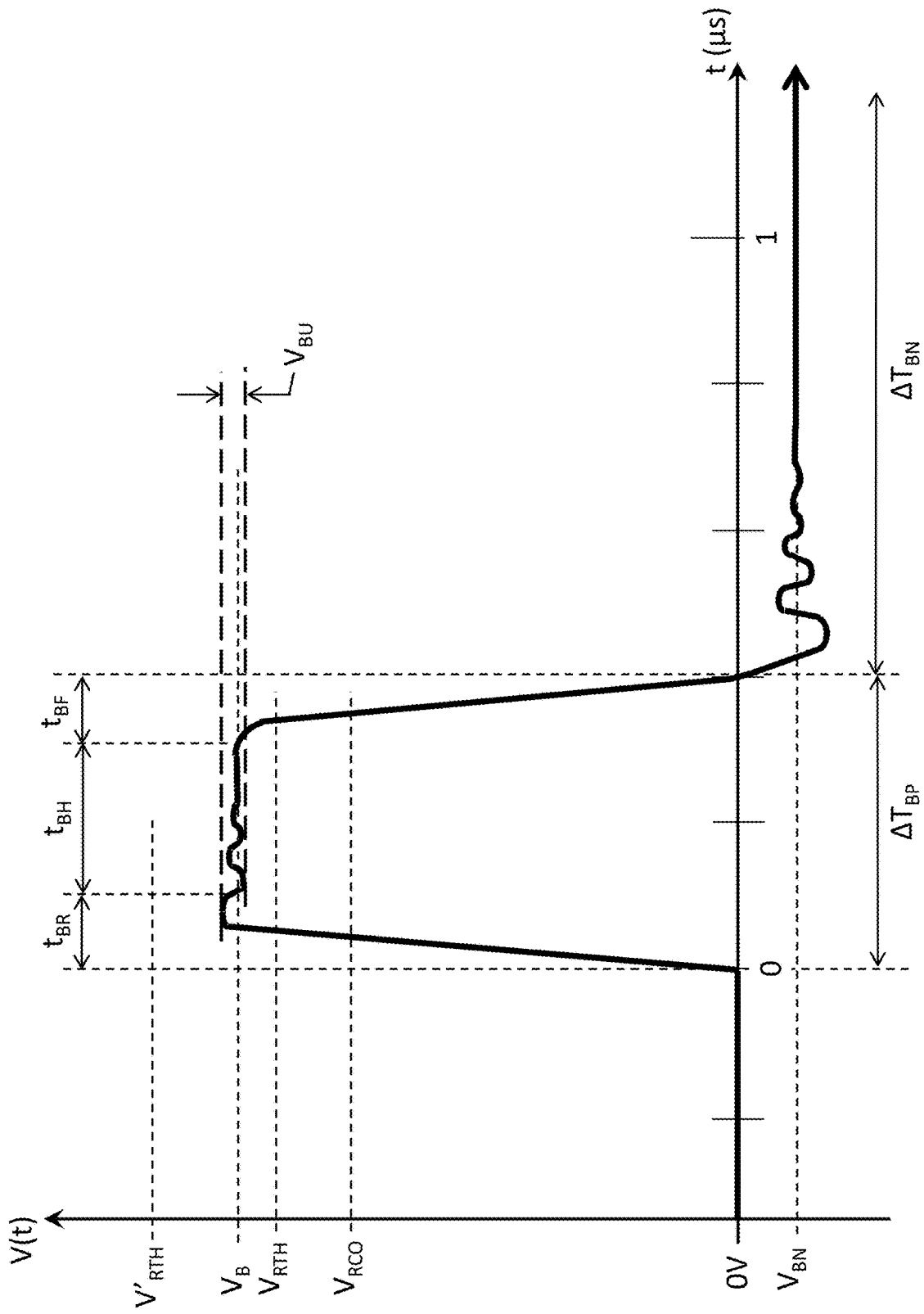
FIG. 10B shows a graph representative of an analog waveform generated from the digitized waveform with predistortion of FIG. 9A through the band-limited linear power amplifier of FIG. 10A under capacitive loading conditions.

FIG. 10B shows a graph representative of an analog waveform generated from the digitized waveform with predistortion, $WF_P$, of FIG. 9A through the band-limited linear power amplifier of FIG. 10A under capacitive loading conditions. In particular, when compared to the waveform described above with reference to FIG. 9B, a reduction in the uncertainty voltage spread, $V_{BU}$, may be observed, indicative of an even larger process window for control/operation of the targeted EEMP reaction. It should be noted that the waveform of FIG. 9B may be reproduced by the conventional power amplifier whose gain versus frequency, $G_2$, is shown in FIG. 10A. In particular, as shown in FIG. 10A, a cut off frequency, $f_{C2}$, of the conventional power amplifier being substantially greater than a cut off frequency, $f_{C1}$, of the band-limited linear power amplifier according to the present teachings, may pass the higher frequency harmonics of the biasing signal, V(t), and therefore reproduce such harmonics as distortion.

Figure 11:
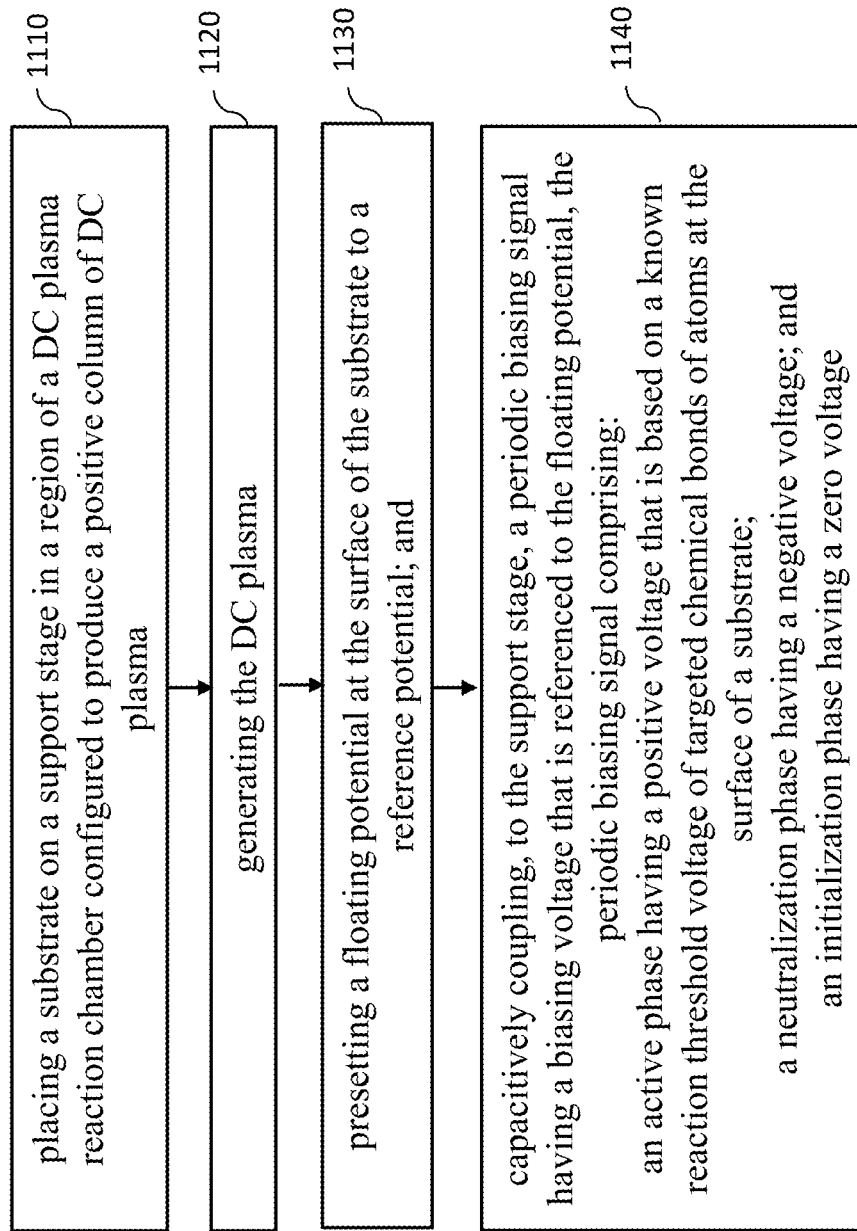
FIG. 11 is a process chart showing various steps of a method according to another embodiment of the present disclosure for processing a surface of a substrate.

FIG. 11 is a process chart (1100) showing various steps of a method according to an embodiment of the present disclosure for processing a surface of a substrate. As shown in FIG. 11, such steps comprise: placing a substrate on a support stage in a region of a DC plasma reaction chamber configured to produce a positive column of DC plasma, according to step (1110); generating the DC plasma, according to step (1120); presetting a floating potential at the surface of the substrate to a reference potential, according to step (1130), and; capacitively coupling, to the support stage, a periodic biasing signal having a biasing voltage that is referenced to the floating potential, the periodic biasing signal comprising: an active phase having a positive voltage that is based on a known reaction threshold voltage of targeted chemical bonds of atoms at the surface of a substrate; a neutralization phase having a negative voltage; and an initialization phase having a zero voltage, according to step (1140).

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A method for processing a surface of a substrate, the method comprising:
   placing a substrate on a support stage in a region of a DC plasma reaction chamber configured to produce a positive column of DC plasma;
   generating the DC plasma;
   presetting a potential at the surface of the substrate to a reference potential; and
   capacitively coupling, to the support stage, a periodic biasing signal having a biasing voltage that is referenced to the reference potential, the periodic biasing signal comprising:
      an active phase having a positive voltage that is based on a known reaction threshold voltage of targeted chemical bonds of atoms at the surface of a substrate;
      a neutralization phase having a negative voltage; and
      an initialization phase having a zero voltage.

2. The method according to claim 1, the method further comprising:
   arranging a reference plate made of a conductive material in the region of the DC plasma reaction chamber that contains the positive column of the DC plasma;
   based on the arranging, measuring a potential at the surface of the reference plate; and
   based on the measuring, presetting the potential at the surface of the reference plate, thereby presetting the potential at the surface of the substrate.

3. The method according to claim 2, the method further comprising:
   adjusting a potential at an anode of the DC plasma reaction chamber; and
   based on the adjusting, presetting the potential at the surface of the reference plate.

4. The method according to claim 1, wherein:
   the positive voltage is a preset voltage that is based on a known reaction threshold voltage of targeted chemical bonds of atoms at the surface of a substrate placed on the support stage.

5. The method according to claim 1, wherein:
   the positive voltage is equal to, or greater than, a reaction threshold voltage of targeted chemical bonds of atoms at the surface of a substrate placed on the support stage.

6. The method according to claim 5, wherein:
   the positive voltage is smaller than a reaction threshold voltage of non-targeted chemical bonds of atoms at the surface of the substrate.

7. The method according to claim 5, wherein:
   the positive voltage is strictly greater than the reaction threshold voltage of the targeted chemical bonds of atoms for a duration of time that is in a range from ¼ to ¾ of a total time length of the active phase.

8. The method according to claim 5, wherein:
   the negative voltage has a magnitude that is sufficiently low to hold energy levels of free ions in the positive column below reaction energy levels of all chemical bonds of atoms at the surface of the substrate.

9. The method according to claim 8, wherein:
   a DC content of the periodic biasing signal is zero.

10. The method according to claim 9, wherein:
    a frequency of the periodic biasing signal is in a range from 100 KHZ to 1 MHz.

11. The method according to claim 10, wherein:
    a ratio of a time length of the active phase to a time length of the neutralization phase is in a range from 1/10 to 1/1.

12. The method according to claim 11, wherein:
    a ratio of a time length of the initialization phase to a time length of one cycle of the periodic biasing signal is about 1/4.

13. The method according to claim 11, wherein:
    the targeted chemical bonds are of atoms of a material that consists of one of: a) a single crystal; b) a metal; or c) a complex or 3D material.

14. The method according to claim 13, wherein:
    the single crystal includes a semiconductor or insulator material.

15. The method according to claim 14, wherein:
    the ratio of the time length of the active phase to the time length of the neutralization phase is about 1/10.

16. The method according to claim 13, wherein:
    the targeted chemical bonds are of atoms of a metal or metal alloy, and
    the ratio of the time length of the active phase to the time length of the neutralization phase is about 1/2.

17. The method according to claim 13, wherein:
    the complex or 3D material includes one of: a polymer; a composite or a three-dimensional material.

18. The method according to claim 17, wherein:
    the ratio of the time length of the active phase to the time length of the neutralization phase is about 1/1.

19. The method according to claim 1, further comprising:
    generating a predistortion in the periodic biasing signal, the predistortion configured to reduce ringing during the active phase.

20. The method according to claim 19, wherein:
    the generating of the predistortion in the periodic biasing signal is based on providing, to a digital signal generator, digital samples that include distortion compensation.

21. The method according to claim 20, wherein:
    the generating of the periodic biasing signal is further based on providing, to a bandlimited linear power amplifier, an output of the digital signal generator to generate therefrom the periodic biasing signal that is capacitively coupled to the support stage,
    wherein
    the bandlimited linear power amplifier comprises a gain that is flat to within 0.75 dB in a frequency range from 10 KHz to 10 MHz, and
    the bandlimited linear power amplifier is configured to substantially block harmonics of the periodic biasing signal.

* * * * *